US012687777B2

(12) United States Patent
Okamoto

(10) Patent No.: US 12,687,777 B2
(45) Date of Patent: *Jul. 21, 2026

(54) RESIN COMPOSITION FOR SOLDER RESIST, SOLDER RESIST FILM, AND CIRCUIT BOARD

(71) Applicant: SEKISUI KASEI CO., LTD., Osaka (JP)

(72) Inventor: Koichiro Okamoto, Osaka (JP)

(73) Assignee: SEKISUI KASEI CO., LTD., Osaka (JP)

( * ) Notice: Subject to any disclaimer, the term of this patent is extended or adjusted under 35 U.S.C. 154(b) by 551 days.

This patent is subject to a terminal disclaimer.

(21) Appl. No.: 18/266,436

(22) PCT Filed: Dec. 17, 2020

(86) PCT No.: PCT/JP2020/047205

§ 371 (c)(1),
(2) Date: Jun. 9, 2023

(87) PCT Pub. No.: WO2022/130574

PCT Pub. Date: Jun. 23, 2022

(65) Prior Publication Data

US 2024/0118609 A1 Apr. 11, 2024

(51) Int. Cl.
*G03F 7/004* (2006.01)
*H05K 3/28* (2006.01)

(52) U.S. Cl.
CPC ............. *G03F 7/004* (2013.01); *H05K 3/287* (2013.01)

(58) Field of Classification Search
CPC ........ G03F 7/004; H05K 3/287; H05K 3/243; H05K 3/244; H05K 1/024; H05K 2201/0154; H05K 2201/0191; H05K 2201/0209; H05K 2201/0212; H05K 2201/0254; H05K 2203/1366; H05K 2203/1372; H05K 3/285; H05K 3/28;
(Continued)

(56) References Cited

U.S. PATENT DOCUMENTS

2017/0342264 A1 11/2017 Jung et al.
2024/0055308 A1* 2/2024 Okamoto .............. H01L 23/295

FOREIGN PATENT DOCUMENTS

JP 2008-174610 A 7/2008
JP 4566870 B2 10/2010
JP 2017-34213 A 2/2017
(Continued)

OTHER PUBLICATIONS

International Search Report and Written Opinion issued in International Patent Application No. PCT/JP2020/047205, dated Jan. 26, 2021, along with an English translation thereof.

*Primary Examiner* — Caleen O Sullivan
(74) *Attorney, Agent, or Firm* — Greenblum & Bernstein, P.L.C.

(57) ABSTRACT

There are provided a resin composition for a solder resist, a solder resist film, and a circuit board that exhibit an excellent low dielectric property by a non-conventional new approach. A resin composition for a solder resist according to an embodiment of the present invention contains a thermosetting resin, an inorganic filler, and hollow resin particles, in which the hollow resin particles are contained in the resin composition for a solder resist in an amount of 1% by weight to 50% by weight.

3 Claims, 4 Drawing Sheets

(58) Field of Classification Search
CPC ............. C08L 101/00; C08L 2203/206; C08L 2205/20; C08K 3/013
USPC ....................................................... 430/270.1
See application file for complete search history.

(56) References Cited

FOREIGN PATENT DOCUMENTS

| | | | |
|---|---|---|---|
| JP | 6083127 | B2 | 2/2017 |
| JP | 2019-90037 | A | 6/2019 |
| WO | 2004/067638 | A1 | 8/2004 |
| WO | 2019/230661 | A1 | 12/2019 |

* cited by examiner

RESIN COMPOSITION FOR SOLDER RESIST, SOLDER RESIST FILM, AND CIRCUIT BOARD

TECHNICAL FIELD

The present invention relates to a resin composition for a solder resist, a solder resist film, and a circuit board.

BACKGROUND ART

In recent years, in accordance with increases in information processing volumes and communication speed of various electronic devices, mounting technologies such as high integration of a semiconductor device to be mounted, high density of wiring, and multi-layering have been rapidly developed. An insulating resin material used in a semiconductor member (a semiconductor package or a semiconductor module) used in semiconductor devices is required to be low in a relative dielectric constant and a dielectric loss tangent of an insulating resin, in order to raise the transmission rate of a high frequency signal and reduce a loss during transmission of a signal. For example, an excellent low dielectric property is required for a solder resist film used in a circuit board.

As one approach to meet such requirements, a technology has been reported in which an excellent low dielectric property is realized by devising a thermosetting resin contained in a thermosetting resin composition for forming an insulating resin and a crosslinking agent used in combination therewith (Patent Literature 1).

CITATION LIST

Patent Literature

Patent Literature 1:JP-A-2019-90037

SUMMARY OF INVENTION

Technical Problem

An object of the present invention is to provide a resin composition for a solder resist, a solder resist film, and a circuit board that exhibit an excellent low dielectric property by a non-conventional new approach.

Solution to Problem

A resin composition for a solder resist according to an embodiment of the present invention is a resin composition for a solder resist containing a thermosetting resin, an inorganic filler, and hollow resin particles, in which the hollow resin particles are contained in the resin composition for a solder resist in an amount of 1% by weight to 50% by weight with respect to the total solid content of the resin composition for a solder resist.

A solder resist film according to an embodiment of the present invention is formed from the resin composition for a solder resist according to an embodiment of the present invention.

A circuit board according to an embodiment of the present invention is a circuit board including a substrate and a conductive circuit formed on the substrate, in which the solder resist film according to an embodiment of the present invention is formed on the outermost layer of the substrate.

Advantageous Effects of Invention

According to an embodiment of the present invention, it is possible to provide a resin composition for a solder resist, a solder resist film, and a circuit board that exhibit an excellent low dielectric property by a non-conventional new approach.

DESCRIPTION OF EMBODIMENTS

Figure 1:
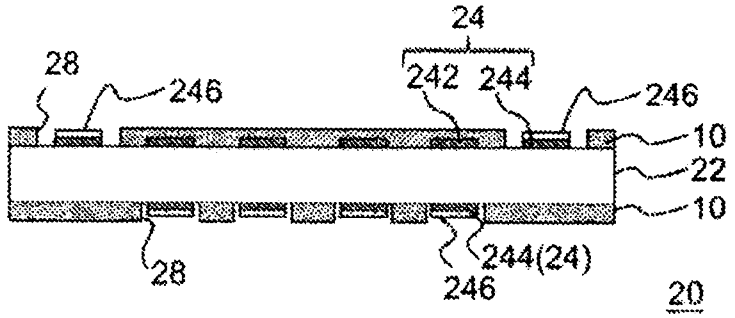
FIG. 1 is a schematic cross-sectional view of a circuit board according to an embodiment of the present invention.

Hereinafter, embodiments of the present invention will be described, but the present invention is not limited to these embodiments.

When the expression "(meth)acrylic" is used in the present specification, it means "acrylic and/or methacrylic", when the expression "(meth)acrylate" is used, it means "acrylate and/or methacrylate", when the expression "(meth) allyl" is used, it means "allyl and/or methallyl", and when the expression "(meth)acrolein" is used, it means "acrolein and/or methacrolein". Furthermore, when the expression "acid (salt)" is used in the present specification, it means "acid and/or salt thereof". Examples of the salt include an alkali metal salt and an alkaline earth metal salt, and specific examples thereof include a sodium salt, a potassium salt, and the like.

A resin composition for a solder resist according to an embodiment of the present invention, a solder resist film according to an embodiment of the present invention, and a circuit board according to an embodiment of the present invention are all members constituting a semiconductor package. Typically, in a semiconductor package, a semiconductor element is mounted on a circuit board. The circuit board typically includes a laminated plate as a core layer, a metal foil provided on at least one surface of the laminated plate, a buildup layer, a metal foil provided on at least one surface of the buildup layer, and a solder resist layer. A space between the circuit board and the semiconductor element is typically underfilled with underfill. The semiconductor element is typically sealed with a sealing material (molded resin).

For the descriptions of a member constituting a semiconductor package and a method for producing the same, which are adopted for each of the resin composition for a solder resist according to an embodiment of the present invention, the solder resist film according to an embodiment of the present invention, and the circuit board according to an embodiment of the present invention, the descriptions of the known members constituting a semiconductor package and a method for producing the same can be referred for the contents not described in the present specification. For example, the descriptions described in Japanese Patent No. 6083127, and JP-A-2017-34213 may be referred to.

Resin Composition for Solder Resist

The resin composition for a solder resist according to an embodiment of the present invention contains a thermosetting resin, an inorganic filler, and hollow resin particles.

The solder resist film according to the embodiment of the present invention is formed by curing the resin composition for a solder resist according to the embodiment of the present invention. When the thermosetting resin contained in the resin composition for a solder resist according to the embodiment of the present invention is cured, the thermosetting resin becomes a resin component in the solder resist film.

The resin composition for the solder resist according to an embodiment of the present invention is typically used in a liquid form in which components contained therein are dissolved and/or dispersed in a solvent such as an organic solvent. Examples of such a solvent include organic solvents such as acetone, methyl ethyl ketone, methyl isobutyl ketone, toluene, ethyl acetate, cyclohexane, heptane, cyclohexane, cyclohexanone, tetrahydrofuran, dimethylformamide, dimethylacetamide, dimethylsulfoxide, ethylene glycol, a cellosolve-based solvent, a carbitol-based solvent, anisole, N-methylpyrrolidone, and the like. The solvent may be used alone or in combination of two or more thereof. The amount of the solvent used can be appropriately adjusted depending on the purpose.

Thermosetting Resin

As the thermosetting resin, any appropriate thermosetting resin can be adopted within a range that does not impair the effect of the present invention. The thermosetting resin may be used alone or in combination of two or more thereof. The thermosetting resin may be used in combination with a prepolymer thereof.

The glass transition temperature of the thermosetting resin is preferably 160° C. to 350° C. and more preferably 180° C. to 300° C. By using the thermosetting resin having a glass transition temperature within this range, lead-free solder reflow heat resistance can be improved.

Examples of the thermosetting resin include a phenol resin such as a novolac-type phenol resin such as a phenol novolac resin, a cresol novolac resin, and a bisphenol A novolac resin, and a resol-type phenol resin such as an unmodified resol phenol resin and an oil-modified resol phenol resin obtained by modification with tung oil, linseed oil, or walnut oil; an epoxy resin such as a bisphenol-type epoxy resin such as a bisphenol A-type epoxy resin, a bisphenol F-type epoxy resin, a bisphenol S-type epoxy resin, a bisphenol E-type epoxy resin, a bisphenol M-type epoxy resin, a bisphenol P-type epoxy resin, and a bisphenol Z-type epoxy resin, a novolac-type epoxy resin such as a phenol novolac-type epoxy resin and a cresol novolac-type epoxy resin, a biphenyl-type epoxy resin, a biphenyl aralkyl-type epoxy resin, an aryl alkylene-type epoxy resin, a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, and a fluorene-type epoxy resin; a urea resin and a resin having a triazine ring such as a melamine resin; an unsaturated polyester resin; a bismaleimide resin; a polyurethane resin; a diallyl phthalate resin; a silicone resin; a resin having a benzoxazine ring; a cyanate resin; a polyimide resin; a polyamide-imide resin; a benzocyclobutene resin; and the like.

From the viewpoint of further exerting the effect of the present invention, it is preferable that the thermosetting resin is at least one selected from the group consisting of a cyanate resin and an epoxy resin.

As the cyanate resin, it is possible to use, for example, a resin obtained by reacting a cyanogen halide compound with phenols and performing prepolymerization as necessary by a method such as heating. Examples of the cyanate resin can include a novolac-type cyanate resin and a bisphenol-type cyanate resin such as a bisphenol A-type cyanate resin, a bisphenol E-type cyanate resin, and a tetramethyl bisphenol F-type cyanate resin; a cyanate resin obtained by a reaction between polyhydric naphthols of a naphthol aralkyl type and a cyanogen halide; a dicyclopentadiene-type cyanate resin; and a biphenyl alkyl-type cyanate resin. Among these cyanate resins, from the viewpoint of further exerting the effect of the present invention, a novolac-type cyanate resin is preferred.

As the weight average molecular weight of the cyanate resin, any appropriate weight average molecular weight can be adopted within a range that does not impair the effect of the present invention. From the viewpoint of further exerting the effect of the present invention, the weight average molecular weight is preferably 500 to 4,500 and more preferably 600 to 3,000. The weight average molecular weight can be measured by, for example, gel permeation chromatography (GPC, standard substance: in terms of polystyrene).

In a case where the resin composition for a solder resist contains the cyanate resin, the cyanate resin is contained in the resin composition for a solder resist in an amount of preferably 5% by weight to 90% by weight, more preferably 10% by weight to 80% by weight, and even more preferably 20% by weight to 50% by weight with respect to the total solid content of the resin composition for a solder resist, from the viewpoint of further exerting the effect of the present invention.

Examples of the epoxy resin include a bisphenol-type epoxy resin such as a bisphenol A-type epoxy resin, a bisphenol F-type epoxy resin, a bisphenol E-type epoxy resin, a bisphenol S-type epoxy resin, a bisphenol M-type epoxy resin, a bisphenol P-type epoxy resin, and a bisphenol Z-type epoxy resin; a novolac-type epoxy resin such as a phenol novolac-type epoxy resin and a cresol novolac-type epoxy resin; an aryl alkylene-type epoxy resin such as a biphenyl-type epoxy resin, a xylylene-type epoxy resin, and a biphenyl aralkyl-type epoxy resin; a phenol aralkyl-type epoxy resin such as a phenol aralkyl-type epoxy resin having a phenylene skeleton and a phenol aralkyl-type epoxy resin having a biphenylene skeleton; a polyfunctional epoxy resin such as a triphenol methane-type epoxy resin and an alkyl-modified triphenol methane-type epoxy resin; a naphthalene-type epoxy resin such as a naphthol-type epoxy resin, a naphthalenediol-type epoxy resin, bi- to tetra-functional epoxy-type naphthalene resins, a naphthylene ether-type epoxy resin, a binaphthyl-type epoxy resin, and a naphthalene aralkyl-type epoxy resin; an anthracene-type epoxy resin; a phenoxy-type epoxy resin; a dicyclopentadiene-type epoxy resin; a norbornene-type epoxy resin; an adamantane-type epoxy resin; a fluorene-type epoxy resin; and a novolac-type epoxy resin having a condensed ring aromatic hydrocarbon structure.

Among the epoxy resins, at least one selected from the group consisting of an aryl alkylene-type epoxy resin, a novolac-type epoxy resin having a condensed ring aromatic hydrocarbon structure, and a naphthalene-type epoxy resin is preferred from the viewpoint of further exerting the effect of the present invention, and a naphthalene-type epoxy resin is more preferred from the viewpoint of improving the embedding property and surface smoothness of the solder resist film.

The aryl alkylene-type epoxy resin is an epoxy resin having one or more aryl alkylene groups in the repeating unit. Examples of the aryl alkylene-type epoxy resin include a xylylene-type epoxy resin and a biphenyl dimethylene-type epoxy resin. Among these, from the viewpoint of further exerting the effect of the present invention, a biphenyl dimethylene-type epoxy resin is preferred.

The novolac-type epoxy resin having a condensed ring aromatic hydrocarbon structure is a novolac-type epoxy resin having naphthalene, anthracene, phenanthrene, tetracene, chrysene, pyrene, triphenylene, tetraphene, or another condensed ring aromatic hydrocarbon structure. Since the novolac-type epoxy resin having a condensed ring aromatic hydrocarbon structure can have a plurality of aromatic rings that is regularly arranged, the resin has excellent low thermal expandability. In addition, since the novolac-type epoxy resin having a condensed ring aromatic hydrocarbon structure has a high glass transition temperature, the resin has excellent heat resistance. Since the molecular weight of the repeating structure of the novolac-type epoxy resin having a condensed ring aromatic hydrocarbon structure is large, the novolac-type epoxy resin is more excellent in flame retardance than conventional novolac-type epoxy, and the weakness of the cyanate resin can be improved by combining the cyanate resin with the novolac-type epoxy resin.

The novolac-type epoxy resin having a condensed ring aromatic hydrocarbon structure is obtained by epoxidizing a novolac-type phenol resin synthesized from a phenolic compound, a formaldehyde compound, and a condensed ring aromatic hydrocarbon compound.

Examples of the phenolic compound include a phenol, cresols such as o-cresol, m-cresol, and p-cresol; xylenols such as 2,3-xylenol, 2,4-xylenol, 2,5-xylenol, 2,6-xylenol, 3,4-xylenol, and 3,5-xylenol; trimethylphenols such as 2,3,5-trimethylphenol; ethylphenols such as o-ethylphenol, m-ethylphenol, and p-ethylphenol; alkylphenols such as isopropylphenol, butylphenol, and t-butylphenol; phenylphenols such as o-phenylphenol, m-phenylphenol, and p-phenylphenol; naphthalenediols such as 1,5-dihydroxynaphthalene, 1,6-dihydroxynaphthalene, and 2,7-dihydroxynaphthalene; polyhydric phenols such as resorcin, catechol, hydroquinone, pyrogallol, and phloroglucinol; and polyhydric alkylphenols such as alkyl resorcin, alkyl catechol, and alkyl hydroquinone. Among these phenolic compounds, a phenol is preferred in terms of the cost and an effect on a degradation reaction.

Examples of the aldehyde compound include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, salicylaldehyde, dihydroxybenzaldehyde, trihydroxybenzaldehyde, and 4-hydroxy-3-methoxyaldehyde paraformaldehyde.

Examples of the condensed ring aromatic hydrocarbon compound include a naphthalene derivative such as methoxynaphthalene and butoxynaphthalene; an anthracene derivative such as methoxyanthracene; a phenanthrene derivative such as methoxyphenanthrene; other tetracene derivatives; a chrysene derivative; a pyrene derivative; a triphenylene derivative; and a tetraphene derivative.

Examples of the novolac-type epoxy resin having a condensed ring aromatic hydrocarbon structure include a methoxynaphthalene-modified ortho-cresol novolac epoxy resin, a butoxynaphthalene-modified meta(para)-cresol novolac epoxy resin, and a methoxynaphthalene-modified novolac epoxy resin.

Examples of the naphthalene-type epoxy resin include naphthalene-type epoxy resins such as a naphthol-type epoxy resin, a naphthalenediol-type epoxy resin, bi- to tetra-functional epoxy-type naphthalene resins, a naphthylene ether-type epoxy resin, a binaphthyl-type epoxy resin, a naphthalene aralkyl-type epoxy resin, and a naphthalene-modified cresol novolac-type epoxy resin.

As the weight average molecular weight of the epoxy resin, any appropriate weight average molecular weight can be adopted within a range that does not impair the effect of the present invention. From the viewpoint of further exerting the effect of the present invention, the weight average molecular weight is preferably 500 to 20,000 and more preferably 800 to 15,000. The weight average molecular weight can be measured by, for example, gel permeation chromatography (GPC, standard substance: in terms of polystyrene).

In a case where the resin composition for a solder resist contains the epoxy resin, the epoxy resin is contained in the resin composition for a solder resist in an amount of preferably 1% by weight to 55% by weight and more preferably 2% by weight to 40% by weight with respect to the total solid content of the resin composition for a solder resist, from the viewpoint of further exerting the effect of the present invention.

In a case where the resin composition for a solder resist contains at least one selected from the group consisting of the cyanate resin and the epoxy resin, the resin composition for a solder resist may further contain a phenol resin. When these resins are used together, a crosslinking density can be controlled, reactivity can be easily controlled, and excellent dimensional stability can be exhibited when preparing the circuit board.

Examples of the phenol resin include a novolac-type phenol resin, a resol-type phenol resin, an aryl alkylene-type phenol resin, and the like.

Among these phenol resins, from the viewpoint of further exerting the effect of the present invention, an aryl alkylene-type phenol resin is preferred. Examples of the aryl alkylene-type phenol resin include a xylylene-type phenol resin and a biphenyl dimethylene-type phenol resin.

As the weight average molecular weight of the phenol resin, any appropriate weight average molecular weight can be adopted within a range that does not impair the effect of the present invention. From the viewpoint of further exerting the effect of the present invention, the weight average molecular weight is preferably 400 to 18,000 and more preferably 500 to 15,000. The weight average molecular weight can be measured by, for example, gel permeation chromatography (GPC, standard substance: in terms of polystyrene).

In a case where the resin composition for a solder resist contains the phenol resin, the phenol resin is contained in the resin composition for a solder resist in an amount of preferably 1% by weight to 55% by weight and more preferably 2% by weight to 40% by weight with respect to the total solid content of the resin composition for a solder resist, from the viewpoint of further exerting the effect of the present invention.

Inorganic Filler

Examples of the inorganic filler include a silicate such as talc, calcined clay, uncalcined clay, mica, and glass; an oxide such as titanium oxide, alumina, boehmite, silica, and fused silica; a carbonate such as calcium carbonate, magnesium carbonate, and hydrotalcite; a hydroxide such as aluminum hydroxide, magnesium hydroxide, and calcium hydroxide; a sulfate or a sulfite such as barium sulfate, calcium sulfate, and calcium sulfite; a borate such as zinc borate, barium metaborate, aluminum borate, calcium borate, and sodium borate; a nitride such as aluminum nitride, boron nitride, silicon nitride, and carbon nitride; and a titanate such as strontium titanate and barium titanate. Among these inorganic fillers, from the viewpoint of further exerting the effect of the present invention, silica is preferred, and fused silica is more preferred. The shape of the fused silica can be, for example, a crashed shape or a spherical shape.

From the viewpoint that the filling property of the inorganic filler can be improved, the inorganic filler is preferably spherical silica.

The inorganic filler may be used alone or in combination of two or more thereof.

The inorganic filler may be an inorganic filler having a monodispersed average particle diameter, or may be an inorganic filler having a polydispersed average particle diameter.

From the viewpoint of further exerting the effect of the present invention, the average particle diameter of the inorganic filler is preferably 0.002 μm to 5.0 μm, more preferably 0.002 μm to 2.0 μm, even more preferably 0.002 μm to 1.0 μm, and particularly preferably 0.002 μm to 0.1 μm. The average particle diameter of the inorganic filler can be obtained by, for example, measuring the particle diameter distribution of the particles based on the volume using a laser diffraction particle diameter distribution measuring apparatus (LA-500, manufactured by HORIBA, Ltd.), and measuring the median diameter thereof (D50) as the average particle diameter.

The inorganic filler is contained in the resin composition for a solder resist in an amount of preferably 10% by weight to 90% by weight, more preferably 20% by weight to 80% by weight, and even more preferably 30% by weight to 75% by weight with respect to the total solid content of the resin composition for a solder resist, from the viewpoint of further exerting the effect of the present invention.

Hollow Resin Particles

The resin composition for a solder resist contains hollow resin particles.

The hollow resin particles are contained in the resin composition for a solder resist in an amount of preferably 1% by weight to 50% by weight, more preferably 3% by weight to 45% by weight, even more preferably 5% by weight to 40% by weight, and particularly preferably 10% by weight to 35% by weight with respect to the total solid content of the resin composition for a solder resist. When the hollow resin particles are contained in the resin composition for a solder resist in an amount within the above range with respect to the total solid content of the resin composition for a solder resist, the effect of the present invention can be further exerted.

Observation of the presence or absence of the hollow and the shape of the hollow resin particles can be performed, for example, by the following method. First, the hollow resin particles as a dry powder are subjected to a surface treatment (10 Pa, 5 mA, 10 seconds) using, for example, a coating device "Osmium Coater Neoc-Pro" manufactured by Meiwafosis Co., Ltd., the hollow resin particles are then observed with a transmission electron microscope (TEM) (H-7600 manufactured by Hitachi High-Technologies Corporation), and thus the presence or absence of the hollow and the shape of the hollow resin particles can be confirmed. In this case, the accelerating voltage can be set to, for example, 80 kV, and the imaging can be performed at a magnification of, for example, 5,000 times or 10,000 times.

The hollow resin particles can be, typically, at least one selected from the group consisting of the following hollow resin particles (1) to (3) according to a preferred embodiment.

Hollow Resin Particles (1) According to Preferred Embodiment

The hollow resin particles (1) are hollow resin particles having a shell portion and a hollow portion surrounded by the shell portion. The term "hollow" as used herein means a state in which the inside is filled with a substance other than a resin, for example, a gas, a liquid, or the like, and preferably means a state in which the inside is filled with a gas, from the viewpoint of further exerting the effect of the present invention.

The hollow portion may be formed of one hollow region or a plurality of hollow regions. It is preferable that the amount of the resin component constituting the shell portion is relatively large, and, from the viewpoint of preventing infiltration of a base material or the like into the hollow portion, the hollow portion is formed of one hollow region.

The average particle diameter of the hollow resin particles (1) is preferably 0.1 μm to 5.0 μm, more preferably 0.15 μm to 1.0 μm, even more preferably 0.2 μm to 0.8 μm, and particularly preferably 0.3 μm to 0.6 μm. When the average particle diameter of the hollow resin particles (1) is within the above range, the effect of the present invention can be further exerted. In a case where the average particle diameter of the hollow resin particles (1) is less than 0.1 μm, the thickness of the shell portion becomes relatively small, and thus the hollow resin particles may not have sufficient strength. In a case where the average particle diameter of the hollow resin particles (1) is greater than 5.0 μm, phase separation between a solvent and a polymer generated by polymerization of monomer components during suspension polymerization may be difficult to occur, and thus the formation of the shell portion may become difficult.

The average particle diameter of the hollow resin particles (1) can be measured by, for example, the following method. First, the average particle diameter Z of the hollow resin particles (1) is measured using a dynamic light scattering method, and the measured average particle diameter Z is used as the average particle diameter of the obtained hollow resin particles (1). That is, first, the slurry hollow resin particles (1) that are obtained are diluted with ion exchanged water, an aqueous dispersion in which the amount of the hollow resin particles is adjusted to 0.1% by weight is irradiated with a laser beam, and the intensity of the light scattered from the hollow resin particles (1) is measured over time in microseconds. The distribution of the detected scattering intensity resulting from the hollow resin particles (1) is applied to a normal distribution, and the average particle diameter Z of the hollow resin particles (1) is obtained by a cumulant analysis method for calculating an average particle diameter. The measurement of the average particle diameter Z can be simply performed using a commercially available particle diameter measuring device. For example, the average particle diameter Z can be measured using a particle diameter measuring device (Zetasizer Nano ZS manufactured by Malvern Panalytical Ltd.). A commercially available particle diameter measuring device is generally equipped with data analysis software, and the data analysis software automatically analyzes the measurement data, by which the average particle diameter Z can be calculated.

The total concentration of the lithium element, the sodium element, the potassium element, the magnesium element, and the potassium element contained in the hollow resin particles (1) is preferably 200 mg/kg or lower, more preferably 150 mg/kg or lower, even more preferably 100 mg/kg or lower, and particularly preferably 50 mg/kg or lower. When the total concentration of the lithium element, the sodium element, the potassium element, the magnesium element, and the potassium element contained in the hollow resin particles (1) is within the above range, the effect of the present invention can be further exerted. When the total concentration of the lithium element, the sodium element, the potassium element, the magnesium element, and the potassium element contained in the hollow resin particles (1) is too high outside the above range, a semiconductor member containing the hollow resin particles (1) may not be able to exhibit an excellent low dielectric property.

The amount of the metal elements contained in the hollow resin particles (1) can be measured, for example, as follows.

Measurement Sample

About 0.5 g of the hollow resin particles are accurately weighed in a washed 50 mL container. 1 mL of ethanol for washing is added into the container, and mixing and dispersing are performed thoroughly. 50 mL of ion exchanged water is further added into the container, and mixing is performed thoroughly. After performing ultrasonic cleaning and extraction for about 10 min, the mixture was allowed to stand in a thermostatic bath at 60° C. for 60 min. The slurry after standing is filtered through a 0.20 μm aqueous chromatography disc to obtain a measurement sample.

Measurement Method

The metal element concentration in the measurement sample is measured under the following conditions. The metal element concentration is obtained from a calibration curve created in advance. The metal element amount is calculated from the following formula.

Metal element amount (mg/kg)=Measured metal element concentration (μg/mL)×51 (mL)/Sample amount (g)

In addition, when the metal element amount is equal to or lower than the lower limit of quantification, the amount is set to 1 mg/kg.

ICP Measurement Conditions

The conditions are as follows.

Measurement apparatus: Multitype ICP emission spectrometer "ICPE-9000" manufactured by Shimadzu Corporation Measured elements: Zn, Ca, Si, Fe, Cr, Na, Mg, Cu, P, K, S, Al, Mn, Ba, Sr Observation direction: axial direction High-frequency output: 1.20 kw Carrier flow rate: 0.7 L/min Plasma flow rate: 10.0 L/min Auxiliary flow rate: 0.6 L/min Exposure time: 30 seconds Standard solutions for calibration curve: "XSTC-13" general-purpose mixture standard solution, mixture of 31 elements (base: 5% $HNO_3$) (about 10 mg/L each) and "XSTC-8" general-purpose mixture standard solution, mixture of 13 elements (base: $H_2O$/trace: HF) (about 10 mg/L each), Spex CertiPrep Inc., U.S.A.

The total concentration of fluoride ions, chloride ions, nitrite ions, nitrate ions, phosphate ions, and sulfate ions contained in the hollow resin particles (1) is preferably 200 mg/kg or lower, more preferably 150 mg/kg or lower, even more preferably 100 mg/kg or lower, and particularly preferably 50 mg/kg or lower. When the total concentration of the fluoride ions, the chloride ions, the nitrite ions, the nitrate ions, the phosphate ions, and the sulfate ions contained in hollow resin particles (1) is within the above range, the effect of the present invention can be further exerted. When the total concentration of the fluoride ions, the chloride ions, the nitrite ions, the nitrate ions, the phosphate ions, and the sulfate ions contained in the hollow resin particles (1) is too high outside the above range, the semiconductor member containing the hollow resin particles (1) may not be able to exhibit an excellent low dielectric property.

The amount of the ions contained in the hollow resin particles (1) can be measured, for example, as follows.

Measurement Sample

About 0.5 g of the hollow resin particles are accurately weighed in a washed 50 mL container. 1 mL of ethanol for washing is added into the container, and mixing and dispersing are performed thoroughly. 50 mL of ion exchanged water is further added into the container, and mixing is performed thoroughly. After performing ultrasonic cleaning and extraction for about 10 min, the mixture is allowed to stand in a thermostatic bath at 60° C. for 60 min. The slurry after standing is filtered through a 0.20 μm aqueous chromatography disc to obtain a measurement sample.

Measurement Method

A standard solution is measured under the following measurement conditions to create a calibration curve. Next, a sample solution is measured under the same conditions. Based on the obtained result, the ion elution concentration is obtained from the calibration curve. The amount of the ion in the sample is calculated from the following formula.

Ion amount (mg/kg)=Measured ion elution concentration(μg/mL)×51(mL)/Sample amount(g)

In addition, when the ion amount is equal to or lower than the lower limit of quantification, the amount is set to 1 mg/kg.

Ion Chromatograph Measurement Conditions

The conditions are as follows.

Measurement apparatus: Ion chromatograph "IC-2001" manufactured by Tosoh Corporation Measured ions: $F^-$, $Cl^-$, $NO_2^-$, $Br^-$, $NO_3^-$, $PO_4^{3-}$, and $SO_4^{2-}$ Column: "TSKGEK SuperIC-AZ" manufactured by Tosoh Corporation Mobile phase: 3.2 mM $Na_2CO_3$+1.9 mM $NaHCO_3$ Flow rate: 0.8 mL/min Column temperature: 40° C.

Injected amount: 30 μL

Shell Portion

The shell portion contains an aromatic polymer (P1) obtained by polymerizing a monomer composition containing an aromatic crosslinking monomer (a), an aromatic monofunctional monomer (b), and a (meth)acrylic acid ester-based monomer (c) represented by formula (1). The effect of the present invention can be further exerted by containing, in the shell portion, the aromatic polymer (P1)

obtained by polymerizing the monomer composition containing the aromatic crosslinking monomer (a), the aromatic monofunctional monomer (b), and the (meth)acrylic acid ester-based monomer (c) represented by formula (1). In particular, the effect of the present invention can be further exerted by adopting the (meth)acrylic acid ester-based monomer (c) having the specific structure as a monomer constituting the aromatic polymer (P1). In addition, the (meth)acrylic acid ester-based monomer (c) having a specific structure is adopted as a monomer constituting the aromatic polymer (P1), such that polar groups contained in the aromatic polymer (P1) can enhance adhesion between the hollow resin particles (1) and the insulating resin.

(1)

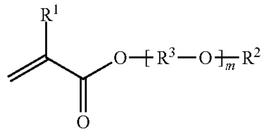

($R^1$ represents H or $CH_3$, $R^2$ represents H, an alkyl group or a phenyl group, $R^3$—O represents an oxyalkylene group having 2 to 18 carbon atoms, and m is an average addition molar number of the oxyalkylene group and represents an integer of 1 to 100.)

From the viewpoint of further exerting the effect of the present invention, the content ratio of the aromatic polymer (P1) contained in the shell portion is preferably 60% by weight to 100% by weight, more preferably 70% by weight to 100% by weight, even more preferably 80% by weight to 100% by weight, and particularly preferably 90% by weight to 100% by weight.

Aromatic Polymer (P1)

The aromatic polymer (P1) is obtained by polymerizing the monomer composition containing the aromatic crosslinking monomer (a), the aromatic monofunctional monomer (b), and the (meth)acrylic acid ester-based monomer (c) represented by formula (1). That is, the aromatic polymer (P1) has a structural unit derived from the aromatic crosslinking monomer (a), a structural unit derived from the aromatic monofunctional monomer (b), and a structural unit derived from the (meth)acrylic acid ester-based monomer (c) represented by formula (1).

From the viewpoint of further exerting the effect of the present invention, the monomer composition preferably contains 10% by weight to 70% by weight of the aromatic crosslinking monomer (a), 10% by weight to 70% by weight of the aromatic monofunctional monomer (b), and 1.0% by weight to 20% by weight of the (meth)acrylic acid ester-based monomer (c) represented by formula (1), more preferably contains 20% by weight to 65% by weight of the aromatic crosslinking monomer (a), 20% by weight to 65% by weight of the aromatic monofunctional monomer (b), and 2.0% by weight to 18% by weight of the (meth)acrylic acid ester-based monomer (c) represented by formula (1), even more preferably contains 30% by weight to 60% by weight of the aromatic crosslinking monomer (a), 30% by weight to 60% by weight of the aromatic monofunctional monomer (b), and 4.0% by weight to 16% by weight of the (meth) acrylic acid ester-based monomer (c) represented by formula (1), and particularly preferably contains 40% by weight to 50% by weight of the aromatic crosslinking monomer (a), 40% by weight to 50% by weight of the aromatic monofunctional monomer (b), and 6.0% by weight to 14% by weight of the (meth)acrylic acid ester-based monomer (c) represented by formula (1).

The monomer composition contains the aromatic crosslinking monomer (a), the aromatic monofunctional monomer (b), and the (meth)acrylic acid ester-based monomer (c), the monomer (c) being represented by formula (1). From the viewpoint of further exerting the effect of the present invention, the total content ratio of the aromatic crosslinking monomer (a), the aromatic monofunctional monomer (b), and the (meth)acrylic acid ester-based monomer (c) represented by formula (1) contained in the monomer composition is preferably 80% by weight to 100% by weight, more preferably 85% by weight to 100% by weight, even more preferably 90% by weight to 100% by weight, and particularly preferably 95% by weight to 100% by weight.

The monomer composition may contain any appropriate additional monomers other than the aromatic crosslinking monomer (a), the aromatic monofunctional monomer (b), and the (meth)acrylic acid ester-based monomer (c) represented by formula (1) within a range that does not impair the effect of the present invention. The additional monomers may be used alone or in combination of two or more thereof.

As the aromatic crosslinking monomer (a), any appropriate aromatic crosslinking monomer can be employed within a range that does not impair the effect of the present invention, as long as the monomer is a crosslinking aromatic monomer. From the viewpoint of further exerting the effect of the present invention, examples of such aromatic crosslinking monomer (a) include divinylbenzene, divinylnaphthalene, diallyl phthalate, and the like. From the viewpoint that the effect of the present invention can be even further exerted and from the viewpoint of reactivity, the aromatic crosslinking monomer (a) is preferably divinylbenzene.

The aromatic crosslinking monomer (a) may be used alone or in combination of two or more thereof.

As the aromatic monofunctional monomer (b), any appropriate aromatic monofunctional monomer can be employed within a range that does not impair the effect of the present invention, as long as the monomer is a monofunctional aromatic monomer. From the viewpoint of further exerting the effect of the present invention, examples of such aromatic monofunctional monomer (b) include styrene, ethylvinylbenzene, a-methylstyrene, vinyltoluene, o-chlorostyrene, m-chlorostyrene, p-chlorostyrene, vinylbiphenyl, vinylnaphthalene, and the like. From the viewpoint that the effect of the present invention can be even further exerted and from the viewpoint of reactivity, the aromatic monofunctional monomer (b) is preferably at least one selected from the group consisting of styrene and ethylvinylbenzene.

The aromatic monofunctional monomer (b) may be used alone or in combination of two or more thereof.

The (meth)acrylic acid ester-based monomer (c) is represented by formula (1).

(1)

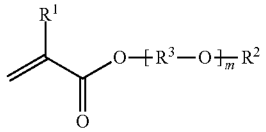

In formula (1), $R^1$ represents H or $CH_3$.

In formula (1), $R^2$ represents H, an alkyl group, or a phenyl group.

In formula (1), $R^3$—O represents an oxyalkylene group having 2 to 18 carbon atoms. That is, in formula (1), $R^3$ represents an alkylene group having 2 to 18 carbon atoms.

In formula (1), $R^3$—O is an oxyalkylene group having 2 to 18 carbon atoms, preferably an oxyalkylene group having 2 to 8 carbon atoms, and more preferably an oxyalkylene group having 2 to 4 carbon atoms. Furthermore, in a case where $R^3$—O is at least two or more selected from an oxyethylene group, an oxypropylene group, and an oxybutylene group, the addition form of the $R^3$—O addition may be any form such as random addition, block addition, or alternating addition. Note that the addition form described herein means the form itself, and does not mean that the form should be obtained by an addition reaction.

From the viewpoint of further exerting the effect of the present invention, $R^3$—O in formula (1) is at least one selected from the group consisting of an oxyethylene group, an oxypropylene group, and an oxybutylene group (typically an oxytetramethylene group).

In formula (1), m represents an average addition molar number (may be referred to as a "chain length") of the oxyalkylene group. m is a number from 1 to 100, preferably a number from 1 to 40, more preferably a number from 2 to 30, even more preferably a number from 3 to 20, particularly preferably a number from 4 to 18, and most preferably a number from 5 to 15. When m is within the above range, the effect of the present invention can be further exerted.

In formula (1), when $R^3$—O is two or more kinds, for example, when $R^3$—O contains an oxyethylene group ($C_2H_4O$) and an oxypropylene group ($C_3H_6O$), m is the total average addition molar number of each oxyalkylene group. Specifically, for example, when —$(R^3—O)_m$— is —$[(C_2H_4O)_p(C_3H_6O)_q]$— (as described above, the addition form may be any form of random addition, block addition, alternate addition, and the like), m=p+q.

From the viewpoint of further exerting the effect of the present invention, examples of the (meth)acrylic acid ester-based monomer (c) include methoxy polyethylene glycol methacrylate, ethoxy polyethylene glycol methacrylate, propoxy polyethylene glycol methacrylate, butoxy polyethylene glycol methacrylate, hexaoxy polyethylene glycol methacrylate, octoxy polyethylene glycol polypropylene glycol methacrylate, lauroxy polyethylene glycol methacrylate, stearoxy polyethylene glycol methacrylate, phenoxy polyethylene glycol polypropylene glycol methacrylate, methoxy polyethylene glycol acrylate, polyethylene glycol monomethacrylate, polypropylene glycol monomethacrylate, polyethylene glycol propylene glycol monomethacrylate, polyethylene glycol tetramethylene glycol monomethacrylate, propylene glycol polybutylene glycol monomethacrylate, monoethylene glycol monoacrylate, polypropylene glycol monoacrylate, and the like.

As the (meth)acrylic acid ester-based monomer (c), a commercially available product can be employed, and for example, trade name "Blemmer" series manufactured by NOF Corporation can be employed.

The (meth)acrylic acid ester-based monomer (c) may be used alone or in combination of two or more thereof.

Non-Crosslinking Polymer (P2)

In addition to the aromatic polymer (P1), the shell portion may further contain a non-crosslinking polymer (P2) that is at least one selected from the group consisting of a polyolefin, a styrene-based polymer, a (meth)acrylic acid-based polymer, and a styrene-(meth)acrylic acid-based polymer.

From the viewpoint of further exerting the effect of the present invention, the content ratio of the non-crosslinking polymer (P2) contained in the shell portion is preferably 0% by weight to 40% by weight, more preferably 0% by weight to 30% by weight, even more preferably 0% by weight to 20% by weight, and particularly preferably 0% by weight to 10% by weight.

Examples of the polyolefin include polyethylene, polypropylene, and poly-α-olefin. From the viewpoint of solubility in the monomer composition, it is preferable to use a low molecular weight polyolefin or an olefin oligomer produced with a side-chain crystalline polyolefin obtained using a long-chain α-olefin as a raw material and a metallocene catalyst.

Examples of the styrene-based polymer include polystyrene, a styrene-acrylonitrile copolymer, and an acrylonitrile-butadiene-styrene copolymer.

Examples of the (meth)acrylic acid-based polymer include polymethyl (meth)acrylate, polyethyl (meth)acrylate, polybutyl (meth)acrylate, and polypropyl (meth)acrylate.

Examples of the styrene-(meth)acrylic acid-based polymer include a styrene-methyl (meth)acrylate copolymer, a styrene-ethyl (meth)acrylate copolymer, a styrene-butyl (meth)acrylate copolymer, and a styrene-propyl (meth)acrylate copolymer.

Relative Dielectric Constant of Hollow Resin Particles (1)

The relative dielectric constant of the hollow resin particles (1) is preferably 1.0 to 2.5, more preferably 1.0 to 2.4, and even more preferably 1.0 to 2.3. When the relative dielectric constant of the hollow resin particles (1) is within the above range, the effect of the present invention can be further exerted. In a case where the relative dielectric constant of the hollow resin particles (1) exceeds 2.5, the semiconductor member containing the hollow resin particles (1) may not be able to exhibit an excellent low dielectric property.

The relative dielectric constant of the hollow resin particles (1) can be calculated by referring to, for example, "Dielectric constant of mixed system" (Applied Physics, Vol. 27, No. 8 (1958)). When the relative dielectric constant of a mixed system of a dispersion medium and the hollow resin particles is ε, the relative dielectric constant of a base material (for example, a resin composition of polyimide, epoxy, or the like) as the dispersion medium is $\varepsilon_1$, the relative dielectric constant of the hollow resin particles is $\varepsilon_2$, and the volume ratio of the hollow resin particles in the mixed system is φ, the following formula is established. That is, the relative dielectric constant $\varepsilon_2$ of the hollow resin particles can be calculated by experimentally obtaining ε, $\varepsilon_1$, and φ.

$$\frac{\varepsilon-\varepsilon_1}{\varepsilon+2\varepsilon_1}=\frac{\varepsilon_2-\varepsilon_1}{\varepsilon_2+2\varepsilon_1}\varphi$$

Note that the volume ratio φ of the hollow resin particles in the mixed system of the dispersion medium and the hollow resin particles can be obtained as follows.

$$\varphi=\frac{\dfrac{\text{Weight of hollow resin particles in mixed system (g)}}{\text{Density of hollow resin particles (g/cm}^3\text{)}}}{\dfrac{\text{Weight of hollow resin particles in mixed system (g)}}{\text{Density of hollow resin particles (g/cm}^3\text{)}}+\dfrac{\text{Weight of base material in mixed system (g)}}{\text{Density of base material (g/cm}^3\text{)}}}$$

The density of the hollow resin particles can be experimentally obtained by using a pycnometer (COTEC Corporation, TQC 50 mL pycnometer) and a liquid polymer ARUFON UP-1080 (Toagosei Co., Ltd., density of 1.05 g/cm$^3$). Specifically, a mixture for evaluation is prepared by defoaming and stirring the hollow resin particles and ARUFON UP-1080 using a planetary stirring and defoaming machine (Mazerustar KK-250, manufactured by KURABO Industries Ltd.) so that the ratio of the hollow resin particles is 10% by weight. A 50 mL pycnometer is filled with the mixture for evaluation, and the weight of the mixture for $$\text{Density of hollow resin particles } (\text{g/cm}^3) = \frac{\text{Weight of mixture for evaluation (g)} \times 0.1}{50(\text{cm}^3) - \dfrac{\text{Weight of mixture for evaluation (g)} \times 0.9}{\text{Density of } UP-1080(\text{g/cm}^3)}}$$

evaluation that fills the pycnometer is calculated by subtracting the weight of an empty pycnometer from the weight of the pycnometer filled with the mixture. The density of the hollow resin particles can be calculated from this value using the following formula.

Production Method for Hollow Resin Particles (1) According to Preferred Embodiment The hollow resin particles (1) can be produced by any appropriate method within a range that does not impair the effect of the present invention.

Such a production method includes, for example, a dispersion step (Step 1), a polymerization step (Step 2), a washing step (Step 3), and a drying step (Step 4).

Step 1: Dispersion Step

Step 1 is a step of dispersing, in an aqueous solution containing a dispersing agent, an organic mixed solution containing the monomer composition containing the aromatic crosslinking monomer (a), the aromatic monofunctional monomer (b), and the (meth)acrylic acid ester-based monomer (c) represented by formula (1), a polymerization initiator, and an organic solvent having a boiling point of lower than 100° C.

For the dispersion of the organic mixed solution in the aqueous solution, any appropriate dispersion method can be adopted within a range that does not impair the effect of the present invention, as long as the organic mixed solution can exist in the form of droplets in the aqueous solution. In such a dispersion method, a homogenizer is typically used, and examples of the homogenizer include an ultrasonic homogenizer, a high-pressure homogenizer, and the like.

The aqueous solution contains an aqueous medium and the dispersing agent.

Examples of the aqueous medium include water and a mixed medium of water and a lower alcohol (methanol, ethanol, or the like). The water is preferably at least one selected from ion exchanged water and distilled water.

As the dispersing agent, any appropriate dispersing agent can be adopted within a range that does not impair the effect of the present invention. From the viewpoint of further exerting the effect of the present invention, it is preferable that a surfactant is employed as the dispersing agent. Examples of the surfactant include an anionic surfactant, a cationic surfactant, an amphoteric surfactant, a nonionic surfactant, and the like.

Examples of the anionic surfactant include a non-reactive anionic surfactant such as alkyl sulfate ester fatty acid salt, alkylbenzenesulfonic acid salt, alkylnaphthalenesulfonic acid salt, alkanesulfonic acid salt, alkyl diphenyl ether sulfonic acid salt, dialkylsulfosuccinic acid salt, monoalkylsulfosuccinic acid salt, and polyoxyethylene alkyl phenyl ether phosphoric acid salt; a reactive anionic surfactant such as polyoxyethylene-1-(allyloxymethyl)alkyl ether sulfate ester ammonium salt, polyoxyethylene alkyl propenyl phenyl ether sulfate ester ammonium salt, and ammonium polyoxyalkylene alkenyl ether sulfate; and the like.

Examples of the cationic surfactant include a cationic surfactant such as alkyltrimethylammonium salt, alkyltriethylammonium salt, dialkyldimethylammonium salt, dialkyldiethylammonium salt, N-polyoxyalkylene-N,N,N-trialkylammonium salt, and the like.

Examples of the amphoteric surfactant include lauryl dimethylamine oxide, a phosphoric acid ester salt, a phosphorous acid ester-based surfactant, and the like.

Examples of the nonionic surfactant include polyoxyethylene alkyl ether, polyoxyethylene alkylphenyl ether, polyoxyethylene fatty acid ester, sorbitan fatty acid ester, polysorbitan fatty acid ester, polyoxyethylene alkylamine, glycerin fatty acid ester, an oxyethylene-oxypropylene block polymer, and the like.

The amount of the surfactant added is preferably 0.01 parts by weight to 1 part by weight with respect to 100 parts by weight of the organic mixed solution. The surfactant may be used alone or in combination of two or more thereof.

The aqueous solution may contain any appropriate additional components within a range that does not impair the effect of the present invention.

The organic mixed solution contains the monomer composition containing the aromatic crosslinking monomer (a), the aromatic monofunctional monomer (b), and the (meth)acrylic acid ester-based monomer (c) represented by formula (1), the polymerization initiator, and the organic solvent having a boiling point of lower than 100° C.

As for the monomer composition contained in the organic mixed solution, the description in the section of <Hollow resin particles (1) according to preferred embodiment> can be referred to as it is.

As the polymerization initiator, any appropriate polymerization initiator can be adopted within a range that does not impair the effect of the present invention.

The polymerization initiator preferably has a 10-hour half-life temperature of 90° C. or lower. When such a polymerization initiator is used, residual polymerization initiator in the hollow resin particles can be completely decomposed. For example, when the semiconductor member containing the hollow resin particles (1) is heated in solder reflow or the like, oxidative degradation of the resin or gas generation caused by the residual polymerization initiator can be suppressed.

It is preferable that the polymerization initiator is polymerized by combining a reaction temperature and reaction time that allows the decomposition rate of the polymerization initiator calculated from the following formula is 98% or higher. Under such polymerization conditions, residual polymerization initiator in the hollow resin particles (1) can be completely decomposed. For example, when the semiconductor member containing the hollow resin particles (1) is heated in solder reflow or the like, oxidative degradation of the resin or gas generation caused by the residual polymerization initiator can be suppressed.

$$\text{Decomposition rate (\%)}=(1-\exp(-k_d t))\times 100$$

$$kd=A\exp(-\Delta E/RT)$$

In the above formula, lid represents the pyrolysis rate constant, t represents the reaction time (hr), A represents the frequency factor ($hr^{-1}$), ΔE represents the activation energy (J/mol), R represents the gas constant (8.314 J/mol·K), and T represents the reaction temperature (K).

Examples of the polymerization initiator include an organic peroxide such as lauroyl peroxide, benzoyl peroxide, ortho-chlorobenzoyl peroxide, ortho-methoxybenzoyl peroxide, 3,5,5-trimethylhexanoyl peroxide, t-butylperoxy-2-ethylhexanoate, and di-t-butyl peroxide; and an azo-based compound such as 2,2'-azobisisobutyronitrile, 1,1'-azobiscyclohexanecarbonitrile, 2,2'-azobis(2,4-dimethylvaleronitrile); and the like.

The amount of the polymerization initiator added is preferably within the range of 0.1 to 5 parts by weight with respect to 100 parts by weight of the monomer composition. The polymerization initiator may be used alone or in combination of two or more thereof.

Examples of the organic solvent having a boiling point of lower than 100° C. include heptane, hexane, cyclohexane, methyl acetate, ethyl acetate, methyl ethyl ketone, chloroform, carbon tetrachloride, and the like. solvent.

The organic solvent having a boiling point of lower than 100° C. may be a mixed

Using the organic solvent having a boiling point of lower than 100° C. as the organic solvent allows the removal of the solvent from the hollow portion of the obtained hollow resin particles (1) to be easy, thus reducing the production cost.

The amount of the organic solvent having a boiling point of lower than 100° C. added is preferably 20 parts by amount to 250 parts by weight with respect to 100 parts by weight of the monomer composition.

The organic mixed solution may contain any appropriate additional components within a range that does not impair the effect of the present invention. Examples of the additional components include the non-crosslinking polymer (P2) described above.

The amount of the non-crosslinking polymer (P2) added is preferably 0 parts by weight to 67 parts by weight with respect to 100 parts by weight of the monomer composition. The non-crosslinking polymer (P2) may be used alone or in combination of two or more thereof.

Step 2: Polymerization Step

Step 2 is a step of performing suspension polymerization by heating a dispersion liquid obtained in Step 1.

As the polymerization temperature, any appropriate polymerization temperature can be adopted within a range that does not impair the effect of the present invention, as long as the temperature is suitable for the suspension polymerization. Such a polymerization temperature is preferably 30° C. to 80° C.

As the polymerization time, any appropriate polymerization time can be adopted within a range that does not impair the effect of the present invention, as long as the time is suitable for the suspension polymerization. Such polymerization time is preferably 1 hour to 20 hours.

Post-heating that is preferably performed after the polymerization is a preferred treatment for obtaining the hollow resin particles (1) at a high level of completion.

As the temperature for the post-heating that is preferably performed after the polymerization, any appropriate temperature can be adopted within a range that does not impair the effect of the present invention. Such a temperature for the post-heating is preferably 50° C. to 120° C.

As the time for the post-heating that is preferably performed after the polymerization, any appropriate time can be adopted within a range that does not impair the effect of the present invention. Such time for the post-heating is preferably 1 hour to 10 hours.

Step 3: Washing Step

Step 3 is a step of washing a slurry obtained in Step 2.

As a washing method, any appropriate washing method can be adopted within a range that does not impair the effect of the present invention. Examples of such a washing method include (1) a method of removing impurities by exerting a very high centrifugal acceleration using a high-speed centrifuge or the like after forming the hollow resin particles (1) to precipitate the hollow resin particles (1) and to remove the supernatant, adding fresh ion exchanged water or distilled water to disperse the precipitated hollow resin particles (1) in the ion exchanged water, and repeating this operation several times; (2) a method of removing impurities by performing washing by a cross-flow filtration method using a ceramic filter or the like; (3) a method of performing washing by a washing solvent including adding to the hollow resin particles (1) a solvent serving as a particle aggregating agent to aggregate and precipitate the particles in the solvent and isolating the hollow resin particles (1) using a filter or the like; and the like.

In the washing method of (1) above, it is preferable that the ion exchanged water or distilled water is used in an amount that is 5 times or greater the weight of the slurry to perform the washing.

On the hollow resin particles (1) with a low specific gravity, the washing is preferably performed by the cross-flow filtration method using a ceramic filter or the like in (2).

Step 4: Drying Step

Step 4 is a step of drying the slurry after washing obtained in Step 3.

As a drying method, any appropriate drying method can be adopted within a range that does not impair the effect of the present invention. Examples of such a drying method include drying by heating.

As the temperature for the heating, any appropriate temperature can be adopted within a range that does not impair the effect of the present invention. Such a temperature for the heating is preferably 50° C. to 120° C.

As the time for the heating, any appropriate time can be adopted within a range that does not impair the effect of the present invention. Such time for the heating is preferably 1 hour to 10 hours.

Hollow Resin Particles (2) According to Preferred Embodiment

The hollow resin particles (2) are hollow resin particles having a hole portion therein. As the structure of the hole portion within the particles, any appropriate structure can be adopted within a range that does not impair the effect of the present invention. From the viewpoint of further exerting the effect of the present invention, examples of such a structure include a porous structure and a single hollow structure. The term "hole portion" as used herein means a state in which the inside is filled with a substance other than a resin, for example, a gas, a liquid, or the like, and preferably means a state in which the inside is filled with a gas, from the viewpoint of further exerting the effect of the present invention.

The volume average particle diameter of the hollow resin particles (2) is preferably 0.5 μm to 100 μm, more preferably 1.0 μm to 80 μm, even more preferably 1.5 μm to 60 μm, and particularly preferably 2.0 μm to 40 μm. When the volume average particle diameter of the hollow resin particles (2) is within the above range, the effect of the present invention can be further exerted. In a case where the volume average particle diameter of the hollow resin particles (2) is too small outside the above range, the surface layer of the particles becomes relatively thin, and thus the hollow resin particles may not have sufficient mechanical strength. In a case where the volume average particle diameter of the hollow resin particles (2) is too large outside the above range, phase separation between a solvent and a polymer generated by polymerization of monomer components during suspension polymerization may be difficult to occur, and thus the formation of the surface layer may become difficult. Note that the volume average particle diameter of the hollow resin particles (2) can be obtained by the Coulter method described below.

The volume average particle diameter of the hollow resin particles (2) can be performed by the Coulter method as follows. That is, the volume average particle diameter of the hollow resin particles (2) is measured by Coulter Multisizer (registered trademark) 3 (a measurement apparatus manufactured by Beckman Coulter, Inc.). The measurement is performed using an aperture calibrated according to the Multisizer (registered trademark) 3 user manual published by Beckman Coulter, Inc. Note that the aperture used in the measurement is suitably selected according to the size of the particles to be measured. Current (aperture current) and Gain are suitably set according to the size of the selected aperture. For example, in a case where an aperture having a size of 50 μm is selected, Current (aperture current) is set to −800, and Gain is set to 4.

As a measurement sample, a dispersion liquid is used, which is obtained by dispersing 0.1 g of the particles in 10 ml of a 0.1% by weight aqueous nonionic surfactant solution using a touch mixer ("TOUCH MIXER MT-31", manufactured by Yamato Scientific Co., Ltd.) and an ultrasonic washing apparatus ("ULTRASONIC CLEANER VS-150", manufactured by Velvo-Clear Co., Ltd.). During the measurement, stirring is performed gently so that air bubbles do not enter the beaker, and the measurement is terminated when 100,000 particles are measured. Note that the volume average particle diameter of the particles is the arithmetic average in the particle distribution of the 100,000 particles based on the volume.

For the hollow resin particles (2), a reduction rate of a relative dielectric constant Dk1 of a film (F1) obtained by mixing 80 parts by weight of polyimide with 20 parts by weight of the hollow resin particles (2) with respect to a relative dielectric constant Dk0 of a film (F0) formed only of the polyimide is preferably 3% or higher, more preferably 5% or higher, even more preferably 10% or higher, and particularly preferably 15% or higher. The higher the reduction rate of the relative dielectric constant Dk1 of the film (F1) with respect to the relative dielectric constant Dk0 of the film (F0), the better. However, in reality, the reduction rate is 35% or lower. When the reduction rate of the relative dielectric constant Dk1 of the film (F1) with respect to the relative dielectric constant Dk0 of the film (F0) is within the above range, the effect of the present invention can be further exerted. When the reduction rate of the relative dielectric constant Dk1 of the film (F1) with respect to the relative dielectric constant Dk0 of the film (F0) is too low outside the above range, the semiconductor member containing the hollow resin particles (2) may not be able to exhibit an excellent low dielectric property.

Note that the reduction rate of the relative dielectric constant Dk1 of the film (F1) with respect to the relative dielectric constant Dk0 of the film (F0) is calculated by the following formula.

$$\text{Reduction rate (\%) of relative dielectric constant } Dk1 \text{ of film } (F1) \text{ with respect to relative dielectric constant } Dk0 \text{ of film } (F0)=[(Dk0-Dk1)/Dk0]\times 100$$

The relative dielectric constant Dk and the dielectric loss tangent Df can be measured, for example, as follows. A mixture for evaluation is prepared by, using any appropriate polyimide resin, dispersing the hollow resin particles (2) to be measured in ethyl acetate in a manner that the concentration of the hollow resin particles (2) with respect to the total solid content (polyimide resin+hollow resin particles (2)) is 20% by weight and performing defoaming and stirring using a planetary stirring and defoaming machine (Mazerustar KK-250, manufactured by KURABO Industries Ltd.). A film sample containing the hollow resin particles (2) was obtained by coating a glass plate having a thickness of 5 mm with the mixture for evaluation using an applicator with the wet thickness set to 250 μm, removing the ethyl acetate by performing heating at 60° C. for 30 minutes, at 90° C. for 10 minutes, at 150° C. for 30 minutes, and at 200° C. for 30 minutes, and then cooling the mixture for evaluation to room temperature. The evaluation of the relative dielectric constant and the dielectric loss tangent of the obtained film is performed by a cavity resonance method (measurement frequency: 5.8 GHz).

For the hollow resin particles (2), a reduction rate of the dielectric loss tangent Df1 of the film (F with respect to the dielectric loss tangent Df0 of the film (F0) is preferably 3% or higher, more preferably 5% or higher, even more preferably 10% or higher, and particularly preferably 15% or higher. The higher the reduction rate of the dielectric loss tangent Df1 of the film (F with respect to the dielectric loss tangent Df0 of the film (F0), the better. However, in reality, the reduction rate is 35% or lower. When the reduction rate of the dielectric loss tangent Df1 of the film (F with respect to the dielectric loss tangent Df0 of the film (F0) is within the above range, the effect of the present invention can be further exerted. When the reduction rate of the dielectric loss tangent Df1 of the film (F with respect to the dielectric loss tangent Df0 of the film (F0) is too low outside the above range, the semiconductor member containing the hollow resin particles (2) may not be able to exhibit an excellent low dielectric property.

Note that the reduction rate of the dielectric loss tangent Df1 of the film (F1) with respect to the dielectric loss tangent Df0 of the film (F0) is calculated by the following formula.

$$\text{Reduction rate (\%) of dielectric loss tangent } Df1 \text{ of film } (F1) \text{ with respect to dielectric loss tangent } Df0 \text{ of film } (F0)=[(Df0-Df1)/Df0]\times 100$$

The specific surface area of the hollow resin particles (2) is preferably 1 $m^2/g$ to 30 $m^2/g$, more preferably 1 $m^2/g$ to 25 $m^2/g$, even more preferably 1 $m^2/g$ to 20 $m^2/g$, and particularly preferably 1 $m^2/g$ to 15 $m^2/g$. When the specific surface area is within the above range, the effect of the present invention can be further exerted. When the specific surface area is too small outside the above range, a void is more likely to be formed on the interface between the particles and the insulating resin, and thus the strength of the insulating resin material may be reduced, and the low-hygroscopicity may be deteriorated. When the specific surface area is too large outside the above range, the strength of the hollow resin particles is reduced, and thus the particles may be broken in the production process, and it may not be possible to maintain the hollow portion.

The specific surface area of the hollow resin particles (2) is measured by the BET method (nitrogen adsorption method) described in JIS Z 8830:2001 of ISO 9277, first edition. For the particles to be measured, a BET nitrogen adsorption isotherm is measured using an automated specific surface area/pore size distribution measurement apparatus “Tristar II” manufactured by Shimadzu Corporation, and the specific surface area is calculated from the amount of nitrogen adsorption using the BET multipoint method. After performing a pretreatment by heating and gas purging, using nitrogen as an adsorbate, the measurement is performed using a constant volume method under the condition of 0.162 $nm^2$ of the cross-sectional area of the adsorbate. Note that the pretreatment is specifically performed by performing nitrogen purging for 20 minutes while heating the container containing the particles at 65° C., cooling to room temperature, and then performing vacuum degassing until the pressure in the container reaches 0.05 mmHg or lower, while heating the container at 65° C.

For the hollow resin particles (2), the bulk specific gravity is preferably 0.01 $g/cm^3$ to 0.6 $g/cm^3$, more preferably 0.02 $g/cm^3$ to 0.55 $g/cm^3$, even more preferably 0.03 $g/cm^3$ to 0.5 $g/cm^3$, and particularly preferably 0.05 $g/cm^3$ to 0.45 $g/cm^3$. When the bulk specific gravity is too low outside the above range, the strength of the hollow resin particles is reduced, and thus the particles may be broken in the production process, and it may not be possible to maintain the hollow portion. When the bulk specific gravity is too high outside the above range, the hollow portion may be reduced, and a sufficient low dielectric property may not be able to be exhibited.

The bulk specific gravity of the hollow resin particles (2) can be measured according to JIS K5101-12-1 (Pigment test method-Part 12: Apparent density or apparent specific volume-Section 1: Static setting method).

The hollow resin particles (2) preferably contain a polymer (P) containing at least one selected from the group consisting of a structural unit (I) derived from a vinyl-based monomer and a structural unit (II) derived from a phosphoric acid ester-based monomer.

Typically, a main component of the hollow resin particles (2) is the polymer (P) containing at least one selected from the group consisting of the structural unit (I) derived from a vinyl-based monomer and the structural unit (II) derived from a phosphoric acid ester-based monomer. Here, the “main component” means that a content ratio in the entirety is preferably 50% by weight or higher, more preferably 70% by weight or higher, even more preferably 90% by weight or higher, particularly preferably 95% by weight or higher, and most preferably 98% by weight or higher.

The content ratio of the polymer (P) contained in the hollow resin particles (2) is preferably 50% by weight to 100% by weight, more preferably 70% by weight to 100% by weight, even more preferably 90% by weight to 100% by weight, particularly preferably 95% by weight to 100% by weight, and most preferably 98% by weight to 100% by weight.

The polymer (P) is preferably a polymer containing both the structural unit (I) derived from a vinyl-based monomer and the structural unit (II) derived from a phosphoric acid ester-based monomer.

In the present specification, the total monomer components used for producing the polymer (P) may be referred to as a monomer composition.

The structural unit (I) derived from a vinyl-based monomer is a structural unit formed in a case where a vinyl-based monomer is subjected to polymerization as one of the total monomer components used for producing the polymer (P). As such a vinyl-based monomer, any appropriate vinyl-based monomer can be adopted within a range that does not impair the effect of the present invention. The vinyl-based monomer may be used alone or in combination of two or more thereof.

Examples of the vinyl-based monomer include a monofunctional vinyl-based monomer having one ethylenic unsaturated group and a polyfunctional vinyl-based monomer having two or more ethylenic unsaturated groups.

Examples of the monofunctional vinyl-based monomer having one ethylenic unsaturated group include a styrene-based monomer, a carboxyl group-containing monomer, a (meth)acrylic acid alkyl ester, a hydroxyl group-containing monomer, a nitrogen atom-containing monomer, an epoxy group-containing monomer, a sulfonic acid group-containing monomer, a phosphoric acid group-containing monomer, a (meth)acrylic acid alkoxyalkyl ester, a (meth)acrylic acid ester having an aromatic hydrocarbon group, vinyl esters, an aromatic vinyl compound, olefins, vinyl ethers, and vinyl chloride.

Examples of the styrene-based monomer include styrene, ethylvinylbenzene, a-methylstyrene, vinyltoluene, o-chlorostyrene, m-chlorostyrene, p-chlorostyrene, vinylbiphenyl, and vinylnaphthalene.

Examples of the carboxyl group-containing monomer include (meth)acrylic acid, itaconic acid, maleic acid, fumaric acid, crotonic acid, and isocrotonic acid, and acid anhydrides thereof (for example, maleic anhydride and itaconic anhydride).

Examples of the (meth)acrylic acid alkyl ester include (meth)acrylic acid alkyl esters having an alkyl group having 1 to 20 carbon atoms, such as methyl (meth)acrylate, ethyl (meth)acrylate, propyl (meth)acrylate, isopropyl (meth) acrylate, n-butyl (meth)acrylate, isobutyl (meth)acrylate, s-butyl (meth)acrylate, t-butyl (meth)acrylate, pentyl (meth) acrylate, isopentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth) acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, cyclopentyl (meth) acrylate, cyclohexyl (meth)acrylate, and isobornyl (meth) acrylate. Note that the alkyl groups as used herein includes an alicyclic hydrocarbon group and an alkyl group having an alicyclic hydrocarbon group. From the viewpoint that the stability of the dispersion liquid is excellent during the suspension polymerization, and the hollow resin particles having a high mechanical strength is easily obtained as a result, the alkyl group is preferably an alkyl group having 1 to 8 carbon atoms and more preferably an alkyl group having 1 to 4 carbon atoms.

Examples of the hydroxyl group-containing monomer include a hydroxyl group-containing (meth)acrylic acid ester, vinyl alcohol, and allyl alcohol. Examples of the hydroxyl group-containing (meth)acrylic acid ester include 2-hydroxyethyl (meth)acrylate, 3-hydroxypropyl (meth) acrylate, 4-hydroxybutyl (meth)acrylate, 6-hydroxyhexyl (meth)acrylate, hydroxyoctyl (meth)acrylate, hydroxydecyl (meth)acrylate, hydroxylauryl (meth)acrylate, and (4-hydroxymethylcyclohexyl) (meth)acrylate.

The nitrogen atom-containing monomer is a monomer having at least one nitrogen atom in the molecule. In the present specification, a monomer having both a hydroxyl group and a nitrogen atom in the molecule is not included in the hydroxyl group-containing monomers, but is included in the nitrogen atom-containing monomers. Examples of the nitrogen atom-containing monomer include a cyclic N-vinyl amide, (meth)acrylamides, an amino group-containing monomer, a cyano group-containing monomer, a heterocycle-containing monomer, an imide group-containing monomer, and an isocyanate group-containing monomer.

Examples of the cyclic N-vinyl amide include N-vinyl-2-pyrrolidone (NVP), N-vinyl-2-piperidone, N-morpholinone, N-vinyl-2-caprolactam, N-vinyl-1,3-oxazin-2-one, and N-vinyl-3,5-morpholinedione Examples of the (meth)acrylamides include (meth)acrylamide, N-alkyl (meth)acrylamide, N,N-dialkyl (meth)acrylamide, N-hydroxyalkyl (meth)acrylamide, and N-alkoxyalkyl (meth)acrylamide.

Examples of the N-alkyl (meth)acrylamide include N-ethyl (meth)acrylamide, N-isopropyl (meth)acrylamide, N-n-butyl (meth)acrylamide, and N-octyl (meth)acrylamide. The N-alkyl (meth)acrylamides also include, for example, a (meth)acrylamide having an amino group, such as dimethylaminoethyl (meth)acrylamide, diethylaminoethyl (meth) acrylamide, and dimethylaminopropyl (meth)acrylamide.

Examples of the N,N-dialkyl (meth)acrylamide include N,N-dimethyl (meth)acrylamide, N,N-diethyl (meth)acrylamide, N,N-dipropyl (meth)acrylamide, N,N-diisopropyl (meth)acrylamide, N,N-di(n-butyl) (meth)acrylamide, and N,N-di(t-butyl) (meth)acrylamide.

Examples of the N-hydroxyalkyl (meth)acrylamide include N-methylol (meth)acrylamide, N-(2-hydroxyethyl) (meth)acrylamide, N-(2-hydroxypropyl) (meth)acrylamide, N-(1-hydroxypropyl) (meth)acrylamide, N-(3-hydroxypropyl) (meth)acrylamide, N-(2-hydroxybutyl) (meth)acrylamide, N-(3-hydroxybutyl) (meth)acrylamide, N-(4-hydroxybutyl) (meth)acrylamide, and N-methyl-N-2-hydroxyethyl (meth)acrylamide.

Examples of the N-alkoxyalkyl (meth)acrylamide include N-methoxymethyl (meth)acrylamide and N-butoxymethyl (meth)acrylamide.

Examples of the amino group-containing monomer include aminoethyl (meth)acrylate, dimethylaminoethyl (meth)acrylate, dimethylaminopropyl (meth)acrylate, and t-butylaminoethyl (meth)acrylate.

Examples of the cyano group-containing monomer include acrylonitrile and methacrylonitrile.

Examples of the heterocyclic ring-containing monomer include (meth)acryloylmorpholine, N-vinylpip era zine, N-vinylpyrrole, N-vinylimidazole, N-vinylpyrazine, N-vinylmorpholine, N-vinylpyrazole, vinylpyridine, vinylpyrimidine, vinyloxazole, vinylisoxazole, vinylthiazole, vinylisothiazole, vinylpyridazine, (meth)acryloylpyrrolidone, (meth)acryloylpyrrolidine, (meth)acryloylpiperidine, and N-methylvinylpyrrolidone.

Examples of the imide group-containing monomer include a maleimide-based monomer such as N-cyclohexylmaleimide, N-isopropylmaleimide, N-laurylmaleimide, and N-phenylmaleimide; an itaconimide-based monomer such as N-methylitaconimide, N-ethylitaconimide, N-butylitaconimide, N-octylitaconimide, N-2-ethylhexylitaconimide, N-laurylitaconimide, and N-cyclohexylitaconimide; and a succinimide-based monomer such as N-(meth)acryloyloxymethylenesuccinimide, N-(meth)acryloyl-6-oxyhexamethylenesuccinimide, and N-(meth)acryloyl-8-oxyoctamethylenesuccinimide.

Examples of the isocyanate group-containing monomer include 2-(meth)acryloyloxyethyl isocyanate.

Examples of the epoxy group-containing monomer include glycidyl (meth)acrylate and methyl glycidyl (meth) acrylate.

Examples of the sulfonic acid group-containing monomer include sodium vinylsulfonate.

Examples of the (meth)acrylic acid alkoxyalkyl ester include 2-methoxyethyl (meth)acrylate, 2-ethoxyethyl (meth)acrylate, methoxytriethylene glycol (meth)acrylate, 3-methoxypropyl (meth)acrylate, 3ethoxypropyl (meth) acrylate, 4-methoxybutyl (meth)acrylate, and 4-ethoxybutyl (meth)acrylate.

Examples of the (meth)acrylic acid ester having an aromatic hydrocarbon group include phenyl (meth)acrylate, phenoxyethyl (meth)acrylate, and benzyl (meth)acrylate.

Examples of the vinyl esters include vinyl acetate and vinyl propionate.

Examples of the aromatic vinyl compound include styrene and vinyl toluene.

Examples of the olefins include ethylene, butadiene, isoprene, and isobutylene.

Examples of the vinyl ethers include a vinyl alkyl ether.

Examples of the polyfunctional vinyl-based monomer having two or more ethylenic unsaturated groups include a polyfunctional (meth)acrylic acid ester-based monomer and an aromatic divinyl-based monomer.

Examples of the polyfunctional (meth)acrylic acid ester-based monomer include ethylene glycol di(meth)acrylate, diethylene glycol di(meth)acrylate, triethylene glycol di(meth)acrylate, tetraethylene glycol di(meth)acrylate, nonaethylene glycol di(meth)acrylate, tetradecaethylene glycol di(meth)acrylate, decaethylene glycol di(meth)acrylate, pentadecaethylene glycol di(meth)acrylate, 1,3-butylene glycol di(meth)acrylate, 1,4-butanediol di(meth)acrylate, 1,6-hexanediol di(meth)acrylate, glycerin di(meth)acrylate, trim ethylolpropane tri(meth)acrylate, pentaerythritol tetra (meth)acrylate, phthalic acid diethylene glycol di(meth) acrylate, caprolactone-modified dipentaerythritol hexa(meth)acrylate, caprolactone-modified hydroxypivalic acid ester neopentyl glycol di(meth)acrylate, polyester (meth) acrylate, and urethane (meth)acrylate.

Examples of the aromatic divinyl-based monomer include divinylbenzene and divinylnaphthalene, and derivatives thereof.

From the viewpoint of further exerting the effect of the present invention, the vinyl-based monomers preferably include the polyfunctional vinyl-based monomer. From the viewpoint of further exerting the effect of the present invention, the content ratio of the polyfunctional vinyl-based monomer contained in the total amount of the vinyl-based monomer is preferably 3% by weight to 70% by weight, more preferably 5% by weight to 50% by weight, even more preferably 7% by weight to 45% by weight, and particularly preferably 10% by weight to 40% by weight. When the content ratio of the polyfunctional vinyl-based monomer contained in the total amount of the vinyl-based monomer is too small outside the above range, the hollow portion may be difficult to be formed within the particles. When the content ratio of the polyfunctional vinyl-based monomer contained in the total amount of the vinyl-based monomer is too large outside the above range, shrinkage of the surfaces of the obtained hollow resin particles (2) may increase, and the mechanical strength may become weakened.

The structural unit (II) derived from a phosphoric acid ester-based monomer is a structural unit formed in a case where a phosphoric acid ester-based monomer is subjected to polymerization as one of the total monomer components used for producing the polymer (P). As such a phosphoric acid ester-based monomer, any appropriate phosphoric acid ester-based monomer can be adopted within a range that does not impair the effect of the present invention. The phosphoric acid ester-based monomer may be used alone or in combination of two or more thereof.

The phosphoric acid ester-based monomer preferably has an ethylenic unsaturated group, from the viewpoint of increasing particle hardness by copolymerization with the vinyl-based monomer near the droplet surface during the suspension polymerization.

As the phosphoric acid ester-based monomer, an acidic phosphoric acid ester-based monomer is preferred, from the viewpoint that, during the suspension polymerization, the monomer is easily oriented toward the droplet surface and interact with an inorganic dispersing agent, and thus the hardness near the particle surface can be increased.

From the viewpoint of further exerting the effect of the present invention, the acidic phosphoric acid ester-based monomer having an ethylenic unsaturated group is preferably a phosphoric acid ester-based monomer represented by formula (1).

(1)

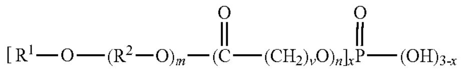

In formula (1), $R^1$ is a (meth)acryl group or an allyl group, $R^2$ is a linear or branched alkylene group, m is an integer of 1 to 30, n is 0 or 1, v is an integer of 1 to 10, and x is 1 or 2.

From the viewpoint of further exerting the effect of the present invention, the phosphoric acid ester-based monomer represented by formula (1) is preferably caprolactone EO-modified phosphate dimethacrylate represented by formula (2), polyoxypropylene allyl ether phosphoric acid ester represented by formula (3), and 2-methacryloyloxyethyl acid phosphate.

(2)

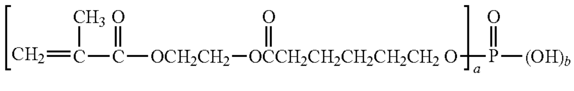

In formula (2), a and b are a=1 and b=2, or a=2, and b=1.

(3)

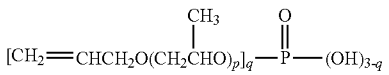

In formula (3), p is an integer of 1 to 30. q is 1 or 2.

The caprolactone EO-modified phosphate dimethacrylate represented by formula (2) is available, for example, under a product name "KAYAMER PM-21" manufactured by Nippon Kayaku Co., Ltd.

The polyoxypropylene allyl ether phosphoric acid ester represented by formula (3) is available, for example, under a product name "Adeka Reasoap PP-70" manufactured by ADEKA Corporation.

In a case where the polymer (P), which is the main component of the hollow resin particles (2), contains both the structural unit (I) derived from a vinyl-based monomer and the structural unit (II) derived from a phosphoric acid ester-based monomer, the phosphoric acid ester-based monomer is contained in the total monomer components used for producing the polymer in an amount of preferably 0.001 parts by weight to 5 parts by weight, more preferably 0.01 parts by weight to 3 parts by weight, even more preferably 0.03 parts by weight to 1 parts by weight, and particularly preferably 0.05 parts by weight to 0.8 parts by weight, with respect to 100 parts by weight of the vinyl-based monomer. When the phosphoric acid ester-based monomer is contained in an amount within the above range with respect to 100 parts by weight of the vinyl-based monomer, the effect of the present invention can be further exerted.

The hollow resin particles (2) may contain any appropriate additional components other than the polymer (P) containing at least one selected from the group consisting of the structural unit (I) derived from a vinyl-based monomer and the structural unit (II) derived from a phosphoric acid ester-based monomer within a range that does not impair the effect of the present invention. The additional components may be used alone or in combination of two or more thereof. Examples of the additional components include a pigment, an antioxidant, a fragrance, an ultraviolet protective agent, a surfactant, an antiseptic agent, and a medicinal component.

Production Method for Hollow Resin Particles (2) According to Preferred Embodiment The hollow resin particles (2) can be produced by any appropriate method within a range that does not impair the effect of the present invention.

Such a production method includes, for example, a dispersion step (Step 1), a polymerization step (Step 2), a washing step (Step 3), and a drying step (Step 4).

Step 1: Dispersion Step

Step 1 is a step of dispersing, in an aqueous solution containing a dispersing agent, an organic mixed solution containing the monomer composition containing at least one selected from the group consisting of the vinyl-based monomer and the phosphoric acid ester-based monomer, a polymerization initiator, and a non-polymerizable organic compound.

For the dispersion of the organic mixed solution in the aqueous solution, any appropriate dispersion method can be adopted within a range that does not impair the effect of the present invention, as long as the organic mixed solution can exist in the form of droplets in the aqueous solution. Such a dispersion method is typically a dispersion method using a homomixer or a homogenizer.

The aqueous solution contains an aqueous medium and the dispersing agent.

Examples of the aqueous medium include water and a mixed medium of water and a lower alcohol (methanol, ethanol, or the like). The water is preferably at least one selected from deionized water, ion exchanged water, and distilled water.

As the dispersing agent, any appropriate dispersing agent can be adopted within a range that does not impair the effect of the present invention. Examples of such a dispersing agent include an inorganic dispersing agent and a surfactant. From the viewpoint of further exerting the effect of the present invention, it is preferable that an inorganic dispersing agent is employed as the dispersing agent. The dispersing agent may be used alone or in combination of two or more thereof.

Examples of the inorganic dispersing agent include salts that are sparingly soluble in water such as a pyrophosphate of an alkaline earth metal (magnesium pyrophosphate or the like), a phosphate of an alkaline earth metal (calcium triphosphate or the like), calcium carbonate, and barium carbonate; an inorganic dispersing agent such as silica and zirconium oxide; and an inorganic high-molecular substance such as talc, bentonite, silicic acid, diatomaceous earth, and viscosity. The alkaline earth metal as used herein is preferably magnesium or calcium. Among the inorganic dispersing agents, a pyrophosphate of an alkaline earth metal and a phosphate of an alkaline earth metal are preferred from the viewpoint that the metal ion interact with the phosphoric acid ester moiety in the phosphoric acid ester-based monomer forming a dense coat on the surface, and as a result, the hollow resin particles having a high mechanical strength can be obtained.

From the viewpoints of ensuring the stability of oil droplets and obtaining hollow resin particles with uniform particle diameters, the amount of the inorganic dispersing agent added is preferably 0.1 parts by weight to 30 parts by weight and more preferably 0.5 parts by weight to 20 parts by weight with respect to 100 parts by weight of the monomer composition (the total monomer components used for producing the polymer (P) which is the main component of the hollow resin particles).

Examples of the surfactant include an anionic surfactant, a cationic surfactant, an amphoteric surfactant, a nonionic surfactant, and the like.

Examples of the anionic surfactant include a non-reactive anionic surfactant such as alkyl sulfate ester fatty acid salt, alkylbenzenesulfonic acid salt, alkylnaphthalenesulfonic acid salt, alkanesulfonic acid salt, alkyl diphenyl ether sulfonic acid salt, dialkylsulfosuccinic acid salt, monoalkylsulfosuccinic acid salt, and polyoxyethylene alkyl phenyl ether phosphoric acid salt; a reactive anionic surfactant such as polyoxyethylene-1-(allyloxymethybalkyl ether sulfate ester ammonium salt, polyoxyethylene alkyl propenyl phenyl ether sulfate ester ammonium salt, and ammonium polyoxyalkylene alkenyl ether sulfate; and the like.

Examples of the cationic surfactant include a cationic surfactant such as alkyltrimethylammonium salt, alkyltriethylammonium salt, dialkyldimethylammonium salt, dialkyldiethylammonium salt, N-polyoxyalkylene-N,N,N-trialkylammonium salt, and the like.

Examples of the amphoteric surfactant include lauryl dimethylamine oxide, a phosphoric acid ester salt, and a phosphorous acid ester-based surfactant.

Examples of the nonionic surfactant include polyoxyethylene alkyl ether, polyoxyethylene alkylphenyl ether, polyoxyethylene fatty acid ester, sorbitan fatty acid ester, polysorbitan fatty acid ester, polyoxyethylene alkylamine, glycerin fatty acid ester, and an oxyethylene-oxypropylene block polymer.

The amount of the surfactant added is preferably 0.01 parts by weight to 1 part by weight with respect to 100 parts by weight of the organic mixed solution. The surfactant may be used alone or in combination of two or more thereof.

The aqueous solution may contain any appropriate additional components within a range that does not impair the effect of the present invention.

The organic mixed solution contains the monomer composition containing at least one selected from the group consisting of the vinyl-based monomer and the phosphoric acid ester-based monomer, the polymerization initiator, and the non-polymerizable organic compound.

As for the monomer composition contained in the organic mixed solution, the description in the section of <Hollow resin particles (2) according to preferred embodiment> can be referred to as it is.

As the polymerization initiator, any appropriate polymerization initiator can be adopted within a range that does not impair the effect of the present invention.

The polymerization initiator preferably has a 10-hour half-life temperature of 90° C. or lower. When such a polymerization initiator is used, residual polymerization initiator in the hollow resin particles (2) can be completely decomposed. For example, when the semiconductor member containing the hollow resin particles (2) is heated in solder reflow or the like, oxidative degradation of the resin or gas generation caused by the residual polymerization initiator can be suppressed.

It is preferable that the polymerization initiator is polymerized by combining a reaction temperature and reaction time that allows the decomposition rate of the polymerization initiator calculated from the following formula is 98% or higher. Under such polymerization conditions, residual polymerization initiator in the hollow resin particles (2) can be completely decomposed. For example, when the semiconductor member containing the hollow resin particles (2) is heated in solder reflow or the like, oxidative degradation of the resin or gas generation caused by the residual polymerization initiator can be suppressed.

$$\text{Decomposition rate (\%)}=(1-\exp(-k_d t))\times 100$$

$$kd=A\exp(-\Delta E/RT)$$

In the above formula, $k_d$ represents the pyrolysis rate constant, t represents the reaction time (hr), A represents the frequency factor ($hr^{-1}$), ΔE represents the activation energy (J/mol), R represents the gas constant (8.314 J/mol·K), and T represents the reaction temperature (K).

Examples of the polymerization initiator include an organic peroxide such as lauroyl peroxide, benzoyl peroxide, ortho-chlorobenzoyl peroxide, ortho-methoxybenzoyl peroxide, 3,5,5-trimethylhexanoyl peroxide, t-butylperoxy-2-ethylhexanoate, and di-t-butyl peroxide; and an azo-based compound such as 2,2'-azobisisobutyronitrile, 1,1'-azobiscyclohexanecarbonitrile, 2,2'-azobis(2,4-dimethylvaleronitrile); and the like.

The amount of the polymerization initiator added is preferably 0.01 parts by weight to 10 parts by weight, more preferably 0.01 parts by weight to 5 parts by weight, and even more preferably 0.1 parts by weight to 5 parts by weight with respect to 100 parts by weight of the monomer composition (the total monomer components used for producing the polymer (P) which is the main component of the hollow resin particles). The polymerization initiator may be used alone or in combination of two or more thereof.

In addition to acting as a so-called solvent, the non-polymerizable organic compound also contributes to the formation of the hollow portion of the porous structure or the single hollow structure within the hollow resin particles (2).

As the non-polymerizable organic compound, an organic solvent having a boiling point of 30° C. or higher and 200°

C. or lower is preferably used, since such an organic solvent exists as a liquid in the temperature range in which the polymerization step (Step 2) is performed. More specifically, as the non-polymerizable organic compound, one or more selected from the group consisting of saturated aliphatic hydrocarbons such as n-pentane, isopentane, n-hexane, cyclohexane, and n-heptane; an aromatic compound such as toluene and benzene; an acetic acid ester-based compound such as ethyl acetate and butyl acetate; and a fluorine-based compound such as a hydrofluoroether and a hydrofluorocarbon can be used.

From the viewpoint of further exerting the effect of the present invention, the amount of the non-polymerizable organic compound used is preferably 10 parts by weight to 250 parts by weight with respect to 100 parts by weight of the monomer composition (the total monomer components used for producing the polymer (P) which is the main component of the hollow resin particles). When the amount of the non-polymerizable organic compound used with respect to 100 parts by weight of the monomer composition is too small outside the above range, it may not be possible to reliably form the hollow portion of the porous structure or the single hollow structure within the hollow resin particles (2). When the amount of the non-polymerizable organic compound used with respect to 100 parts by weight of the monomer composition is too large outside the above range, it may not be possible to impart sufficient strength to the obtained hollow resin particles (2).

The organic mixed solution may contain any appropriate additional components within a range that does not impair the effect of the present invention.

Step 2: Polymerization Step

Step 2 is a step of performing suspension polymerization by heating a dispersion liquid obtained in Step 1.

As the polymerization temperature, any appropriate polymerization temperature can be adopted within a range that does not impair the effect of the present invention, as long as the temperature is suitable for the suspension polymerization. Such a polymerization temperature is preferably 30° C. to 105° C.

As the polymerization time, any appropriate polymerization time can be adopted within a range that does not impair the effect of the present invention, as long as the time is suitable for the suspension polymerization. Such polymerization time is preferably 0.1 hours to 20 hours.

Post-heating that is preferably performed after the polymerization is a preferred treatment for obtaining the hollow resin particles at a high level of completion.

As the temperature for the post-heating that is preferably performed after the polymerization, any appropriate temperature can be adopted within a range that does not impair the effect of the present invention. Such a temperature for the post-heating is preferably 50° C. to 120° C.

As the time for the post-heating that is preferably performed after the polymerization, any appropriate time can be adopted within a range that does not impair the effect of the present invention. Such time for the post-heating is preferably 1 hour to 10 hours.

Step 3: Washing Step

Step 3 is a step of washing a slurry obtained in Step 2.

As a washing method, any appropriate washing method can be adopted within a range that does not impair the effect of the present invention. Examples of such a washing method include (1) a method of removing impurities by exerting a very high centrifugal acceleration using a high-speed centrifuge or the like after forming the hollow resin particles (2) to precipitate the hollow resin particles and to remove the supernatant, adding fresh ion exchanged water or distilled water to disperse the precipitated hollow resin particles (2) in the ion exchanged water, and repeating this operation several times; (2) a method of removing impurities by performing washing by a cross-flow filtration method using a ceramic filter or the like; (3) a method of performing washing by a washing solvent including adding to the hollow resin particles (2) a solvent serving as a particle aggregating agent to aggregate and precipitate the particles in the solvent and isolating the hollow resin particles (2) using a filter or the like; and the like.

In the washing method of (1) above, it is preferable that the ion exchanged water or distilled water is used in an amount that is 5 times or greater the weight of the slurry to perform the washing.

On the hollow resin particles (2) with a low specific gravity, the washing is preferably performed by the cross-flow filtration method using a ceramic filter or the like in (2).

Step 4: Drying Step

Step 4 is a step of drying the slurry after washing obtained in Step 3.

As a drying method, any appropriate drying method can be adopted within a range that does not impair the effect of the present invention. Examples of such a drying method include drying by heating.

As the temperature for the heating, any appropriate temperature can be adopted within a range that does not impair the effect of the present invention. Such a temperature for the heating is preferably 50° C. to 120° C.

As the time for the heating, any appropriate time can be adopted within a range that does not impair the effect of the present invention. Such time for the heating is preferably 1 hour to 50 hours.

Hollow Resin Particles (3) According to Preferred Embodiment and Production Method Therefor The hollow resin particles (3) are multi-hollow resin particles having two or more independent hollow portions therein. As such multi-hollow resin particles, any appropriate multi-hollow resin particles can be adopted within a range that does not impair the effect of the present invention. Examples of such multi-hollow resin particles and a production method therefor include the multi-hollow resin particles described in Japanese Patent No. 4566870.

Other Additives

The resin composition for a solder resist may contain other additives. The other additives may be used alone or in combination of two or more thereof.

As the other additives, any appropriate additives can be adopted within a range that does not impair the effect of the present invention. Examples of the other additives include a coupling agent, a curing accelerator, a curing agent, an organic filler, a pigment, a dye, an antifoaming agent, a leveling agent, an ultraviolet absorbing agent, a foaming agent, an antioxidant, a flame retardant, and an ion scavenger.

As the curing agent, any appropriate curing agent can be adopted within a range that does not impair the effect of the present invention. Such a curing agent can be, for example, a curing agent generally used for a resin composition for semiconductor sealing, and examples thereof include a phenol-based curing agent, an amine-based curing agent, an acid anhydride-based curing agent, a mercaptan-based curing agent, an isocyanate compound such as an isocyanate prepolymer or a blocked isocyanate, and organic acids such as a carboxylic acid-containing polyester resin. Among these curing agents, a phenol-based curing agent is preferred, from the viewpoint of the balance among flame resistance, moisture resistance, electrical characteristics, curability, storage stability, and the like.

Examples of the phenol-based curing agent include a novolac resin (a phenol novolac resin, a cresol novolac resin, or the like) obtained by condensation or co-condensation of phenols such as phenol, cresol, resorcin, catechol, bisphenol A, bisphenol F, phenylphenol, aminophenol, a-naphthol, β-naphthol, and dihydroxynaphthalene with formaldehyde or ketones in the presence of an acidic catalyst; a phenol aralkyl resin such as a phenol aralkyl resin having a biphenylene skeleton synthesized from the above phenols and dimethoxy-p-xylene or bis(methoxymethyl)biphenyl and a phenol aralkyl resin having a phenylene skeleton; and a phenol resin having a trisphenol methane skeleton.

Examples of the amine-based curing agent include an aliphatic polyamine such as diethylenetriamine (DETA), triethylenetetramine (TETA), and meta-xylylenediamine (MXDA); an aromatic polyamine such as diaminodiphenylmethane (DDM), m-phenylenediamine (MPDA), and diaminodiphenyl sulfone (DDS); and polyamine compounds including dicyandiamide (DICY), an organic acid dihydrazide, and the like.

Examples of the acid anhydride-based curing agent include an alicyclic acid anhydride such as hexahydrophthalic anhydride (HHPA), methyltetrahydrophthalic anhydride (MTHPA), and maleic anhydride; and an aromatic acid anhydride such as trimellitic anhydride (TMA), pyromellitic dianhydride (PMDA), benzophenonetetracarboxylic acid (BTDA), phthalic anhydride, and the like.

Examples of the mercaptan-based curing agent include trimethylolpropane tris(3-mercaptobutyrate) and trimethylolethane tris(3-mercaptobutyrate).

The curing agent is contained in the resin composition for a solder resist in an amount of preferably 0.1% by weight to 20% by weight, more preferably 0.5% by weight to 15% by weight, even more preferably 1.0% by weight to 10% by weight, and particularly preferably 1.5% by weight to 8% by weight with respect to the total solid content of the resin composition for a solder resist. When the curing agent is contained in the resin composition for a solder resist in an amount within the above range with respect to the total solid content of the resin composition for a solder resist, the effect of the present invention can be further exerted.

As the coupling agent, any appropriate coupling agent can be adopted within a range that does not impair the effect of the present invention. Examples of such a coupling agent include a silane-based compound; a titanium-based compound; aluminum chelates; and an aluminum/zirconium-based compound.

Examples of the silane based compound include hydrolysates of vinyltrichlorosilane, vinyltrimethoxysilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropyltriethoxysilane, γ-glycidoxypropylmethyldimethoxysilane, γ-methacry loxypropylmethyldiethoxysilane, γ-methacryloxypropyltriethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, phenylaminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane, γ-mercaptopropylmethyldimethoxysilane, 3-isocyanatopropyltriethoxysilane, 3-acryloxypropyltrimethoxysilane, and 3-triethoxysilyl-N-(1,3-dimethylbutylidene)propylamine.

Examples of the titanium based compound include isopropyl triisostearoyl titanate, isopropyl tris(dioctylpyrophosphate) titanate, isopropyl tri(N-aminoethyl-aminoethyl) titanate, tetraoctyl bis(ditridecylphosphite) titanate, tetra, 2-diallyloxymethyl-1-butylkis(ditridecyl)phosphite titanate, bis(dioctylpyrophosphate)oxyacetate titanate, bis(dioctylpyrophosphate)ethylene titanate, isopropyl trioctanoyl titanate, isopropyl dimethacryl isostearoyl titanate, isopropyl tridodecylbenzenesulfonyl titanate, isopropyl isostearoyl diacryl titanate, isopropyl tri(dioctylphosphate) titanate, isopropyl tricumyl phenyl titanate, and tetraisopropyl bis(dioctylphosphite) titanate.

The coupling agent is contained in the resin composition for a solder resist in an amount of preferably 0.01% by weight to 5% by weight, more preferably 0.05% by weight to 3% by weight, even more preferably 0.07% by weight to 1% by weight, and particularly preferably 0.1% by weight to 0.5% by weight with respect to the total solid content of the resin composition for a solder resist. When the coupling agent is contained in the resin composition for a solder resist in an amount within the above range with respect to the total solid content of the resin composition for a solder resist, the effect of the present invention can be further exerted.

Solder Resist Film

A solder resist film according to an embodiment of the present invention is formed from the resin composition for a solder resist according to an embodiment of the present invention. The solder resist film according to the embodiment of the present invention is typically formed by curing the resin composition for a solder resist according to the embodiment of the present invention. When the thermosetting resin contained in the resin composition for a solder resist according to the embodiment of the present invention is cured, the thermosetting resin becomes a resin component in the solder resist film.

The solder resist film according to the embodiment of the present invention can be obtained by, for example, curing the resin composition for a solder resist by performing a solvent removal treatment on a coating film (resin film) formed by applying the resin composition for a solder resist in a form of a varnish on a carrier base material. The content ratio of the solvent contained in the solder resist film according to the embodiment of the present invention is preferably 5% by weight or lower, more preferably 3% by weight or lower, and even more preferably 1% by weight or lower with respect to the entire solder resist film.

As the carrier base material, any appropriate carrier base material can be adopted within a range that does not impair the effect of the present invention. As such a carrier base material, for example, a polymer film or a metal foil can be adopted. Examples of the polymer film include a polyolefin such as polyethylene and polypropylene; a polyester such as polyethylene terephthalate and polybutylene terephthalate; polycarbonate; release paper such as a silicone sheet; a fluorine-based resin; and a polyimide resin. Examples of the metal foil include copper and/or a copper-based alloy, aluminum, an aluminum-based alloy, iron, an iron-based alloy, silver, a silver-based alloy, gold, a gold-based alloy, zinc, a zinc-based alloy, nickel, a nickel-based alloy, tin, and a tin-based alloy. As the carrier base material, polyethylene terephthalate is preferred from the viewpoints of a low cost and simple adjustment of peel strength.

As the thickness of the carrier base material, any appropriate thickness can be adopted within a range that does not impair the effect of the present invention. Such a thickness is, for example, 10 μm to 100 μm, and more preferably 10 μm to 70 μm.

As a method for forming the coating film (resin film) by applying the resin composition for a solder resist in the form of a varnish on the carrier base material, any appropriate method can be adopted within a range that does not impair the effect of the present invention. Examples of such a method include a method of applying the resin composition for a solder resist in the form of a varnish on the carrier base material using various coater apparatuses and a method of spray coating the carrier base material with the resin varnish using a spray apparatus. Among these methods, the method of applying the resin varnish on the carrier base material using various coater apparatuses such as a comma coater and a die coater is preferred.

The solvent removal treatment can be performed at any appropriate temperature for any appropriate time within a range that does not impair the effect of the present invention. The temperature for the solvent removal treatment is preferably 50° C. to 200° C., more preferably 80° C. to 180° C., and even more preferably 100° C. to 150° C. The time for the solvent removal treatment is preferably 1 second to 24 hours, more preferably 10 seconds to 12 hours, even more preferably 30 seconds to 1 hour, and particularly preferably 1 minute to 10 minutes.

Circuit Board

A circuit board according to an embodiment of the present invention includes a substrate and a conductive circuit formed on the substrate, in which the solder resist film according to an embodiment of the present invention is formed on the outermost layer of the substrate. The circuit board according to the embodiment of the present invention may include any appropriate additional member within a range that does not impair the effect of the present invention, as long as the circuit board includes the substrate, the conductive circuit, and the solder resist film according to the embodiment of the present invention.

FIG. 1 is a schematic cross-sectional view of the circuit board according to an embodiment of the present invention. A circuit board 20 is a circuit board including a substrate (core substrate 22) and a conductive circuit (conductor pattern 24) formed on the substrate, in which a solder resist film 10 according to an embodiment of the present invention is formed on the outermost layer of the substrate. The conductor pattern 24 is provided on at least one outermost surface of the core substrate 22. The solder resist film 10 constitutes the outermost layer of the circuit board 20. The solder resist film 10 is provided around the conductor pattern 24. A plurality of opening portions 28 is provided on the solder resist film 10. A part of a conductive portion of the conductor pattern 24 is positioned within at least one opening portion 28.

In the circuit board 20, the core substrate 22 is a substrate including at least one insulating layer. The insulating layer included in the core substrate 22 is, for example, a resin base material formed by impregnating a fiber base material with a resin composition. The core substrate 22 typically contains a resin component formed from a thermosetting resin. The core substrate 22 may be a rigid substrate or a flexible substrate. The thickness of the core substrate 22 is, for example, 10 μm to 300 μm.

The core substrate 22 may be a single-sided plate having only one insulating layer and the conductor pattern 24 that is formed on only one surface thereof, may be a double-sided plate having only one insulating layer and the conductor patterns 24 that are provided on both the front and rear surfaces thereof, or may be a multilayer plate having two or more insulating layers. In a case where the core substrate 22 is a multilayer plate, the core substrate 22 includes one or more wiring layers sandwiched between two insulating layers. In a case where the core substrate 22 is a double-sided plate or a multilayer plate, the conductor pattern 24 provided on one surface of the core substrate 22 (outermost surface) is electrically connected to the conductor pattern 24 provided on the surface of the opposite side (outermost surface) or the wiring layer provided within the core substrate 22 through a through-hole (not shown) that penetrates at least a part of the insulating layer.

The conductor pattern 24 is provided on at least one of the front surface and the rear surface (outermost surface) of the core substrate 22. The conductor pattern 24 is a pattern formed by, for example, performing selective etching on a copper film laminated on the core substrate 22. The conductor pattern 24 includes at least a land 244 and a line 242 as the conductive portions. The land 244 is mainly a connecting portion that electrically connects an element or a component mounted on the circuit board 20 to the conductor pattern 24. For example, the land 244 is a circular or square portion connected to another portion of the conductor pattern 24 or the wiring layer in the core substrate 22. Note that a hole through which a terminal of an electronic component or the like is inserted may be provided in the center of the land 244. In addition, the line 242 is mainly a linear portion that electrically connects the lands 244 to each other.

Since the solder resist film 10 is laminated on the conductor pattern 24, the insulation property can be maintained, and a highly reliable circuit board can be obtained. Furthermore, since the solder resist film 10 is arranged on the upper and lower outermost layers, the color can be, for example, black, and the appearance on the lower surface of the circuit board can be improved. In addition, a mark can be affixed on the lower surface of the solder resist film 10 by, for example, laser such as YAG laser.

In the solder resist film 10, mainly, an opening portion is provided in an area where the land 244 is provided, and the land 244 is not covered with the solder resist film 10. That is, the solder resist film 10 is not provided on the land 244, and thus the land 244 is exposed. Note that, for example, a conductive film such as a nickel and gold plated film and a solder plated film may be laminated on the land 244. In the circuit board 20, a plated film 246 is further provided on the land 244 positioned in the opening portion. In the solder resist film 10, an opening portion may be further provided in a portion other than the land 244, and an opening portion that partially exposes the line 242 may also be present. Moreover, it is not necessary that all lands 244 are positioned in the opening portion, and the land 244 covered with the solder resist film 10 may also be present.

The circuit board 20 can be used as, for example, an interposer or motherboard. Note that a package refers to a circuit board on which various parts are mounted and collectively sealed. A semiconductor package is an example of the package, and the packages also include collectively sealed electric control units (E CUs) or the like.

EXAMPLES

Hereinafter, the present invention will be specifically described with reference to Examples, but the present invention is not limited to these Examples. Note that, unless otherwise specified, “part(s)” means “part(s) by weight”, and “%” means “% by weight”.

In Examples, the following raw materials were used.

- Epoxy resin A: biphenyl aralkyl-type novolac epoxy resin (NC-3000, manufactured by Nippon Kayaku Co., Ltd.)
- Epoxy resin B: naphthalene skeleton-modified cresol novolac-type epoxy resin (EXA-7320, manufactured by DIC Corporation)
- Cyanate resin A: novolac-type cyanate resin (Primaset PT-30, manufactured by Lonza Group Ltd)
- Cyanate resin B: bisphenol A-type cyanate resin (Primaset BA230, manufactured by Lonza Group Ltd)
- Phenol resin A: biphenyl dimethylene-type phenol resin (GPH-103, manufactured by Nippon Kayaku Co., Ltd.)
- Phenoxy resin A: phenoxy resin having bisphenol acetophenone structure Inorganic filler A: spherical silica (SO-32R, manufactured by Admatechs Company Limited, average particle diameter of 1 μm)
- Coupling agent A: γ-glycidoxypropyltrimethoxysilane (A187, manufactured by GE Toshiba Silicones Co., Ltd.)
- Curing catalyst A: phosphorus-based catalyst of onium salt compound (C05-MB, manufactured by Sumitomo Bakelite Co., Ltd.)
- Curing catalyst B: dicyandiamide
- Coloring agent A: phthalocyanine blue/benzimidazolone/methyl ethyl ketone (=1/1/8) mixture (manufactured by Sanyo Color Works, Ltd.)

Measurement of Volume Average Particle Size

The measurement of the volume average particle diameter of particles was performed by the Coulter method as follows.

The volume average particle diameter of the particles was measured by Coulter Multisizer (registered trademark) 3 (a measurement apparatus manufactured by Beckman Coulter, Inc.). The measurement was performed using an aperture calibrated according to the Multisizer (registered trademark) 3 user manual published by Beckman Coulter, Inc. Note that the aperture used in the measurement was suitably selected according to the size of the particles to be measured. Current (aperture current) and Gain are suitably set according to the size of the selected aperture. For example, in a case where an aperture having a size of 50 μm is selected, Current (aperture current) is set to −800, and Gain was set to 4.

As a measurement sample, a dispersion liquid was used, which was obtained by dispersing 0.1 g of the particles in 10 ml of a 0.1% by weight aqueous nonionic surfactant solution using a touch mixer (“TOUCH MIXER MT-31”, manufactured by Yamato Scientific Co., Ltd.) and an ultrasonic washing apparatus (“ULTRASONIC CLEANER VS-150”, manufactured by Velvo-Clear Co., Ltd.). During the measurement, stirring was performed gently so that air bubbles did not enter the beaker, and the measurement was terminated when 100,000 particles were measured. Note that the volume average particle diameter of the particles was the arithmetic average in the particle distribution of the 100,000 particles based on the volume.

Bulk Specific Gravity

The bulk specific gravity of the particles was measured according to JIS K5101-12-1 (Pigment test method-Part 12: Apparent density or apparent specific volume-Section 1: Static setting method).

Specific Surface Area

The specific surface area of the particles was measured by the BET method (nitrogen adsorption method) described in JIS Z 8830:2001 of ISO 9277, the first edition. For the particles to be measured, a BET nitrogen adsorption isotherm was measured using an automated specific surface area/pore size distribution measurement apparatus “Tristar II” manufactured by Shimadzu Corporation, and the specific surface area was calculated from the amount of nitrogen adsorption using the BET multipoint method.

After performing a pretreatment by heating and gas purging, using nitrogen as an adsorbate, the measurement was performed using a constant volume method under the condition of 0.162 $nm^2$ of the cross-sectional area of the adsorbate. Note that the pretreatment was specifically performed by performing nitrogen purging for 20 minutes while heating the container containing the particles at 65° C., cooling to room temperature, and then performing vacuum degassing until the pressure in the container reached 0.05 mmHg or lower, while heating the container at 65° C.

TEM Measurement: Observation of Hollow Resin Particles

A surface treatment was performed on a dry powder of hollow resin particles using a coating device “Osmium Coater Neoc-Pro” manufactured by Meiwafosis Co., Ltd. (10 Pa, 5 mA, 10 seconds). Then, the hollow resin particles were observed with a transmission electron microscope (TEM) (H-7600 manufactured by Hitachi High-Technologies Corporation), and thus the presence or absence of the hollowness and the shape of the hollow resin particles were identified. In this case, the accelerating voltage was set to 80 kV, and the imaging was performed at a magnification of 5,000 times or 10,000 times.

SEM Observation

The particles were imaged with a scanning electron microscope (SEM), thus obtaining a surface SEM image. Furthermore, after embedding the particles in the epoxy resin and cutting the epoxy resin into thin sections, the cross-sections of the particles were imaged with a scanning electron microscope (SEM), thus obtaining a cross-sectional SEM image.

[Production Example 1] Production of Porous Hollow Resin Particles (1)

An oil phase was prepared by mixing 105 parts by weight of methyl methacrylate, 45 parts by weight of trimethylolpropane trimethacrylate, 0.3 parts by weight of “KAYAMER (registered trademark) PM-21" (manufactured by Nippon Kayaku Co., Ltd.) as a polymerizable monomer having an acidic phosphoric acid ester group, 0.75 parts by weight of 2,2'-azobis(2,4-dimethylvaleronitrile) (trade name "ABN-V", manufactured by Japan Finechem Inc., 10-hour half-life temperature=51° C., activation energy ΔE=122.7 kJ/mol, frequency factor $A=1.80\times10^{18}$ $hr^{-1}$) as a polymerization initiator, and 75 parts by weight of ethyl acetate and 75 parts by weight of cyclohexane as non-polymerizable organic compounds.

An aqueous phase was also prepared by mixing 900 parts by weight of deionized water as an aqueous medium and 23 parts by weight of magnesium pyrophosphate generated by a double decomposition method as a dispersing agent.

Next, the oil phase was dispersed in the aqueous phase using TK-homomixer (manufactured by PRIMIX Corporation) at 8,000 rpm for 5 minutes, thus obtaining a dispersion liquid in which the volume average particle diameter was about 8 μm. Thereafter, the dispersion liquid was put into a polymerization vessel equipped with a stirrer and a thermometer, the internal temperature of the polymerization vessel was increased to 55° C., and stirring was continued for 5 hours. Then, the suspension polymerization reaction was terminated by increasing the internal temperature of the polymerization vessel to 70° C. (second temperature rise) and stirring the suspension solution at 70° C. for 7 hours (decomposition rate of ABN-V=99.57%).

After cooling the obtained suspension solution, the dispersing agent contained in the suspension solution (magnesium pyrophosphate) was decomposed by hydrochloric acid. Then, the suspension solution was dehydrated by filtration to isolate the solid content, and the solid content was washed by sufficient water. Thereafter, the non-polymerizable organic compound was removed by performing vacuum drying at 70° C. for 24 hours, and spherical resin particles were obtained.

The volume average particle diameter of the obtained resin particles was 7.8 μm. According to the SEM observation, the obtained resin particles were porous hollow resin particles (1) of which the insides were porous. The bulk specific gravity of the porous hollow resin particles (1) was 0.33 g/ml.

When the specific surface areas were measured before and after subjecting the porous hollow resin particles (1) to a treatment with a jet mill at a pressure of 0.4 MPa, the specific surface areas were 8.2 $m^2/g$ and 23.2 $m^2/g$. This suggests that the smaller the difference between the numerical values of the specific surface areas before and after the jet milling, the more sufficient durability and strength the particles have with respect to the impact of the jet milling, which means that the particles are not broken by an external force such as shear force and pressure during the production of the semiconductor member.

Figure 2:
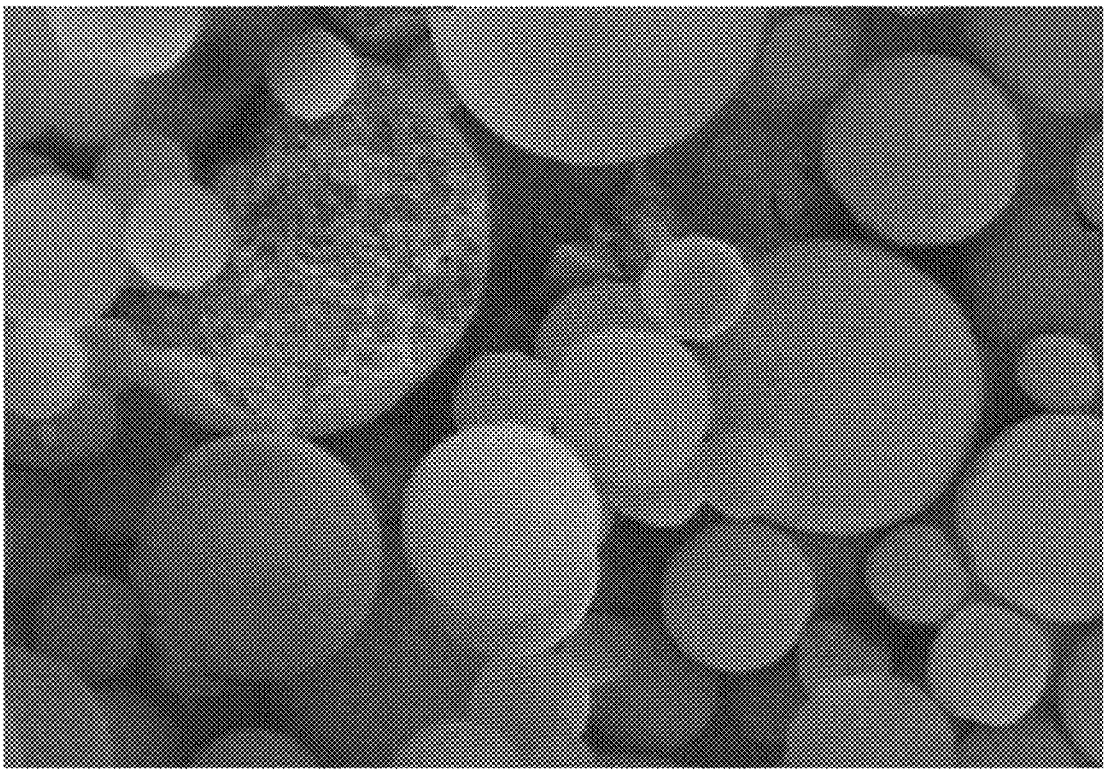
FIG. 2 is a surface SEM image of porous hollow resin particles (1) obtained in Production Example 1.
Figure 3:
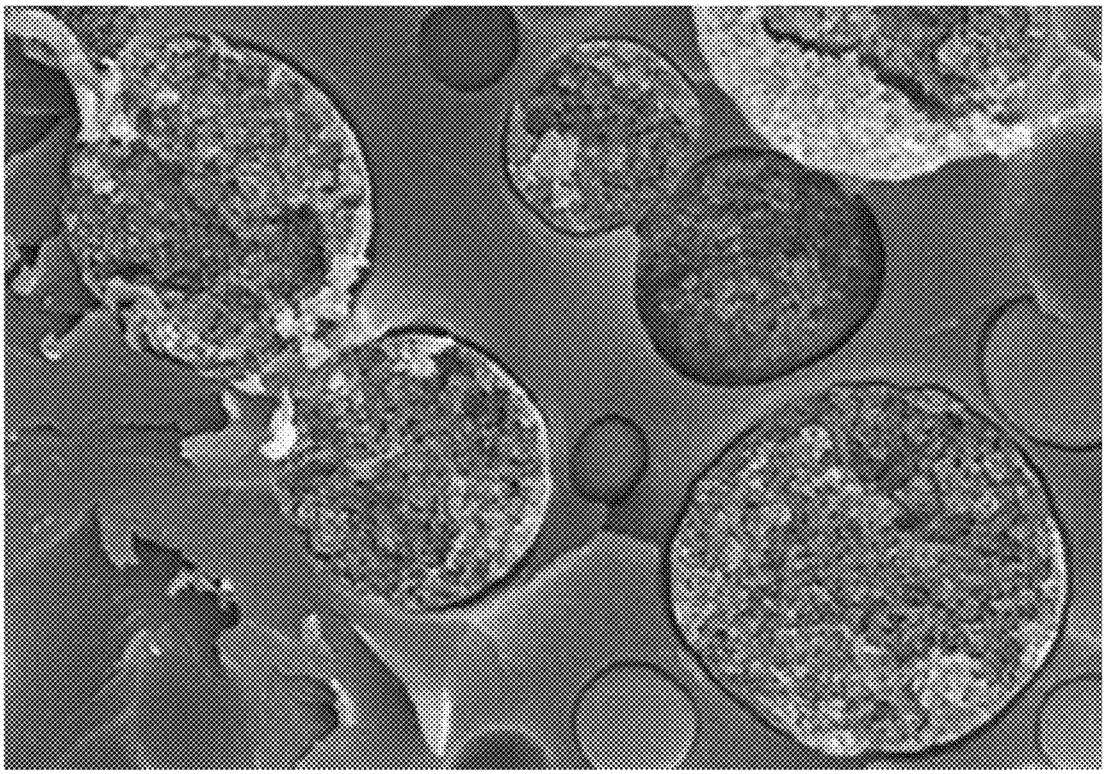
FIG. 3 is a cross-sectional SEM image of the porous hollow resin particles (1) obtained in Production Example 1.

The surface SEM image of the porous hollow resin particles (1) is shown in FIG. 2. The cross-sectional SEM image of the porous hollow resin particles (1) is shown in FIG. 3. In the resin particles (1) produced using a (meth) acrylic acid alkyl ester and a polyfunctional (meth)acrylic acid ester-based monomer, it was confirmed that the particle surfaces were dense shells without holes, and the particles had a porous structure inside.

[Production Example 2]: Production of Single Hollow Resin Particles (1)

An oil phase was prepared by mixing 1.15 g of styrene (St), 1.85 g of divinylbenzene (DVB) 810 (manufactured by NIPPON STEEL Chemical & Material Co., Ltd., a product containing 81% thereof, 19% of ethylvinylbenzene (EVB)), 2.4 g of heptane, 0.3 g of HS Crysta 4100 (side-chain crystalline polyolefin, manufactured by HOKOKU Corporation), 0.3 g of Blemmer 50PEP-300 (polyethylene glycol propylene glycol monomethacrylate, manufactured by NOF Corporation), and 0.099 g of LPO (trade name "Peroyl L", manufactured by NOF Corporation, 10-hour half-life temperature=61.6° C., activation energy ΔE=126.5 kJ/mol, frequency factor $A=3.81\times10^{18}$ $hr^{-1}$) as an oil-soluble polymerization initiator.

Next, an aqueous phase was prepared by mixing 34 g of ion exchanged water and 0.017 g of Rapisol A-80 (surfactant, manufactured by NOF Corporation).

Figure 4:
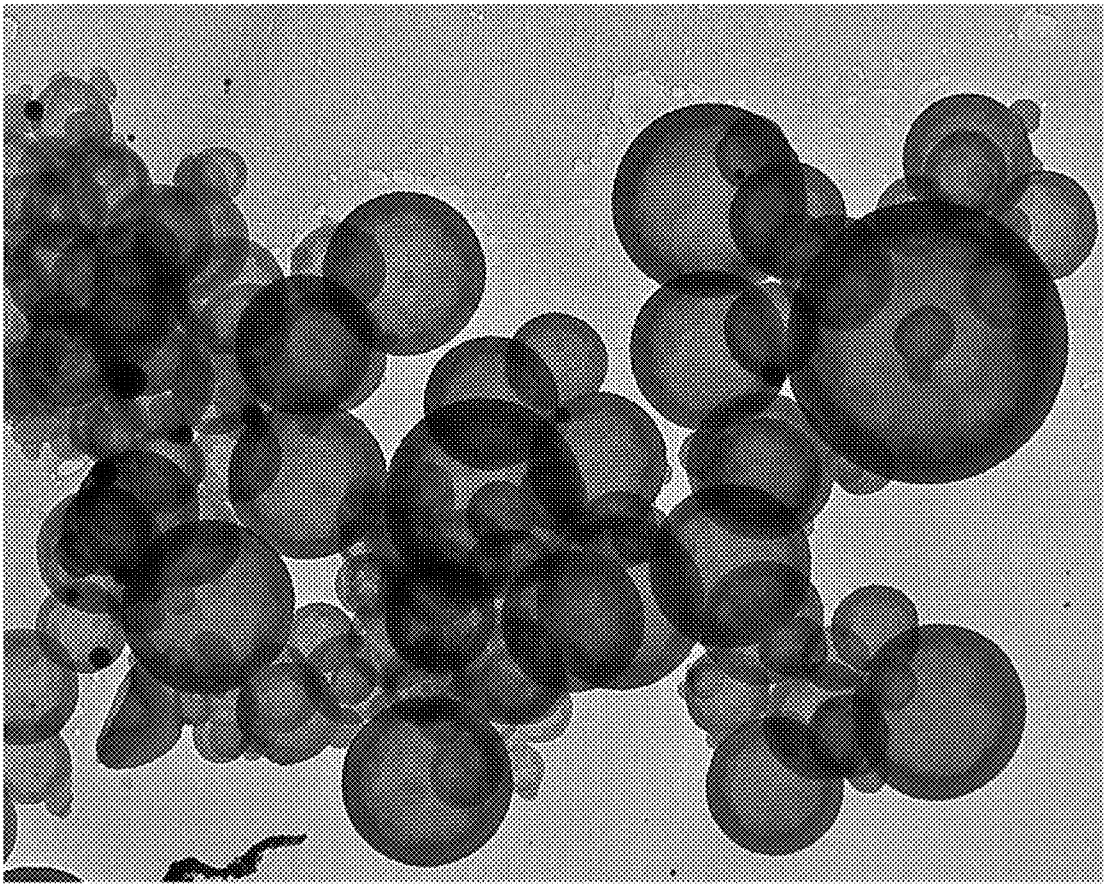
FIG. 4 is a TEM photograph of surfaces of single hollow resin particles (1) obtained in Production Example 2.

The oil phase was added to the aqueous phase, and a suspension solution was prepared using an ultrasonic homogenizer (SONIFIER 450, manufactured by Branson Ultrasonics Corporation, conditions: Duty Cycle=50%, Output Control=5, and treatment time of 3 minutes). Polymerization was performed by subjecting the obtained suspension solution to heating at 70° C. for 4 hours, and a slurry was obtained. By heating the obtained slurry at 100° C. for 24 hours, a dry powder of hollow resin particles was obtained. The average particle diameter of the obtained hollow resin particles was 356 nm, and the particle density was 0.65 $g/cm^3$. The TEM observation result for the obtained hollow resin particles is shown in FIG. 4. It was confirmed that the obtained hollow resin particles were single hollow resin particles (1) having hollowness surrounded by shells.

Example 1

25 parts by weight of the novolac-type cyanate resin (Primaset PT-30, manufactured by Lonza Japan Ltd) as the cyanate resin A, 25 parts by weight of the biphenyl aralkyl-type novolac epoxy resin (NC-3000, manufactured by Nippon Kayaku Co., Ltd.) as the epoxy resin A, 10 parts by weight of the phenoxy resin having a bisphenol acetophenone structure prepared above as the phenoxy resin A, and 0.4 parts by weight of an imidazole compound (1-benzyl-2-phenylimidazole, manufactured by Shikoku Kasei Holdings Corporation) as a curing accelerator were dissolved and dispersed in methyl ethyl ketone. 20.0 parts by weight of the porous hollow resin particles (1) obtained in Production Example 1, 19.0 parts by weight of the spherical silica (SO-32R, manufactured by Admatechs Company Limited, average particle diameter of 1 μm) as the inorganic filler A, 0.2 parts by weight of the γ-glycidoxypropyltrimethoxysilane (A187, manufactured by GE Toshiba Silicones Co., Ltd.) as the coupling agent A, and 0.4 parts by weight of the phthalocyanine blue/benzimidazolone/methyl ethyl ketone (=1/1/8) mixture (manufactured by Sanyo Color Works, Ltd.) in terms of the solid content as the coloring agent A were further added, stirring was performed for 30 minutes using a high-speed stirrer, and the amount of the non-volatile content was adjusted to 50% by weight, thus preparing a resin composition (1) for a solder resist.

The resin composition (1) for a solder resist was applied to a PET film coated with a release agent using an applicator, and then the solvent in the resin composition (1) for a solder resist was removed by drying so as to perform thermal curing, thus obtaining a solder resist film (1) having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 2.86, and the dielectric loss tangent was 0.0136.

Example 2

A resin composition (2) for a solder resist was prepared in a similar manner to Example 1, except that the single hollow resin particles (1) obtained in Production Example 2 were used instead of the porous hollow resin particles (1) obtained in Production Example 1.

The resin composition (2) for a solder resist was applied to a PET film coated with a release agent using an applicator, and then the solvent in the resin composition (2) for a solder resist was removed by drying so as to perform thermal curing, thus obtaining a solder resist film (2) having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 3.01, and the dielectric loss tangent was 0.0143.

Example 3

A resin composition (3) for a solder resist was prepared in a similar manner to Example 1, except that 10.0 parts by weight of the porous hollow resin particles (1) obtained in Production Example 1 and 10 parts by weight of the single hollow resin particles (1) obtained in Production Example 2 were used instead of 20.0 parts by weight of the porous hollow resin particles (1) obtained in Production Example 1.

The resin composition (2) for a solder resist was applied to a PET film coated with a release agent using an applicator, and then the solvent in the resin composition (3) for a solder resist was removed by drying so as to perform thermal curing, thus obtaining a solder resist film (3) having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 3.16, and the dielectric loss tangent was 0.0150.

Comparative Example 1

A resin composition (C1) for a solder resist was prepared in a similar manner to Example 1, except for using 39.0 parts by weight of the spherical silica (SO-32R, manufactured by Admatechs Company Limited, average particle diameter of 1 μm) as the inorganic filler A instead of using 20.0 parts by weight the porous hollow resin particles (1) obtained in Production Example 1 and 19.0 parts by weight of the spherical silica (SO-32R, manufactured by Admatechs Company Limited, average particle diameter of 1 μm) as the inorganic filler A.

The resin composition (2) for a solder resist was applied to a PET film coated with a release agent using an applicator, and then the solvent in the resin composition (C1) for a solder resist was removed by drying so as to perform thermal curing, thus obtaining a solder resist film (C1) having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 3.67, and the dielectric loss tangent was 0.0160.

Example 4

Preparation of Resin Varnish A 11.0 parts by weight of the biphenyl aralkyl-type novolac epoxy resin (NC-3000, manufactured by Nippon Kayaku Co., Ltd.) as the epoxy resin A, 8.8 parts by weight of the biphenyl dimethylene-type phenol resin (GPH-103, manufactured by Nippon Kayaku Co., Ltd.) as the phenol resin A, 16.0 parts by weight of the novolac-type cyanate resin (Primaset PT-30, manufactured by Lonza Japan Ltd) as the cyanate resin A, and 4.0 parts by weight of the bisphenol A-type cyanate resin (Primaset BA230, manufactured by Lonza Japan Ltd) as the cyanate resin B were dissolved and dispersed in methyl ethyl ketone. 20.0 parts by weight of the porous hollow resin particles (1) obtained in Production Example 1, 40.0 parts by weight of the spherical silica (SO-32R, manufactured by Admatechs Company Limited, average particle diameter of 1 μm) as the inorganic filler A, and 0.2 parts by weight of the γ-glycidoxypropyltrimethoxysilane (A187, manufactured by GE Toshiba Silicones Co., Ltd.) as the coupling agent A were further added, stirring was performed for 30 minutes using a high-speed stirrer, and the amount of the non-volatile content was adjusted to 50% by weight, thus preparing a resin varnish A which was a varnish of the resin composition.

The resin varnish A was applied to a PET film coated with a release agent using an applicator, and then the solvent in the resin composition was removed by drying so as to perform thermal curing, thus obtaining a film having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 2.69, and the dielectric loss tangent was 0.0216.

Production of Carrier Materials A and B

The obtained resin varnish A was applied to a PET film (polyethylene terephthalate, manufactured by Dupont Teijin Films, Purex film, thickness of 36 μm) using a die coater apparatus so that the dried resin layer had a thickness of 13.0 μm, and drying was performed for 5 minutes using a drying apparatus at 160° C., thus obtaining a resin sheet A with a PET film for a first resin layer (carrier material A).

In addition, the obtained resin varnish A was applied to a PET film (polyethylene terephthalate, manufactured by Dupont Teijin Films, Purex film, thickness of 36 μm) in a similar manner so that the dried resin layer had a thickness of 7.0 μm, and drying was performed for 5 minutes using a drying apparatus at 160° C., thus obtaining a resin sheet B with a PET film for a second resin layer (carrier material B).

Production of Prepreg 1 (P1)

The obtained carrier material A and carrier material B were arranged on the two surfaces of a glass fiber base material (thickness of 15 μm, manufactured by Unitika Glass Fiber Co., Ltd., E glass woven fabric, E02Z 04 53SK, IPC standard 1015, coefficient of linear expansion: 5.5 ppm/° C.) so that each of the resin layers faced the glass fiber base material, and the glass fiber base material was impregnated with the resin composition by a vacuum laminator and a hot-air drying apparatus, thus obtaining a prepreg on which the PET film was laminated.

Specifically, each of the carrier material A and the carrier material B was superimposed on the two surfaces of the glass fiber base material so that the carrier materials were positioned in the center of the glass fiber base material in the width direction, and the carrier materials and the glass fiber base material were bonded using a laminating roll at 80° C. under the condition of reducing the pressure by 9.999x10 4 Pa (about 750 Torr) or more from the normal pressure.

Here, the resin layers of the carrier material A and the carrier material B were respectively bonded to the two surface sides of the glass fiber base material in the inner area of the glass fiber base material in the dimension of the width direction, and in the outer area of the glass fiber base material in the dimension of the width direction, the resin layers of the carrier material A and the carrier material B were bonded to each other.

Next, a prepreg 1 (P1) was obtained by subjecting the bonded product to a heat treatment without applying pressure, by allowing the bonded product to pass through a horizontal transfer-type hot-air drying apparatus set to 120° C. for 2 minutes. At this time, the thickness of the first resin layer (C1) was 9 μm, the thickness of the glass fiber base material layer was 15 μm, and the thickness of the second resin layer (C2) was 3 μm. Therefore, the total thickness was 27 μm, and C2/C1 was 0.33. Note that the thickness of the resin layer was measured by cutting out the cross-section of the prepreg 1(P1) and observing the cross-section with an optical microscope.

Preparation of Laminated Plate (1) With Metal Foil

The PET film was peeled off from each of the two surfaces two obtained prepregs 1 (P1), and the prepregs were laminated so that the first resin layers faced each other. A copper foil of 12 μm (3EC-VLP foil, manufactured by Mitsui Mining & Smelting Co., Ltd.) was superimposed on the two surfaces of the obtained laminate, and hot compression molding was performed at 220° C. and 3 MPa for 2 hours, thus obtaining a laminated plate (1) with a metal foil. The thickness of a core layer (the portion formed of the laminated plate) of the obtained laminated plate (1) with a metal foil was 0.054 mm. Note that the thicknesses of the prepregs and the resin layers hardly changed before and after the curing. Therefore, the thickness of the core layer (the portion formed of the laminated plate) is the sum of the thicknesses of the prepregs.

Preparation of Resin Varnish G 25 parts by weight of the novolac-type cyanate resin (Primaset PT-30, manufactured by Lonza Japan Ltd) as the cyanate resin A, 25 parts by weight of the biphenyl aralkyl-type novolac epoxy resin (NC-3000, manufactured by Nippon Kayaku Co., Ltd.) as the epoxy resin A, 10 parts by weight of the phenoxy resin having a bisphenol acetophenone structure prepared above as the phenoxy resin A, and 0.4 parts by weight of an imidazole compound (1-benzyl-2-phenylimidazole, manufactured by Shikoku Kasei Holdings Coration) as a curing accelerator were dissolved and dispersed in methyl ethyl ketone. 20.0 parts by weight of the porous hollow resin particles (1) obtained in Production Example 1, 19.4 parts by weight of the spherical silica (SO-32R, manufactured by Admatechs Company Limited, average particle diameter of 1 μm) as the inorganic filler A, and 0.2 parts by weight of the γ-glycidoxypropyltrimethoxysilane (A187, manufactured by GE Toshiba Silicones Co., Ltd.) as the coupling agent A were further added, stirring was performed for 30 minutes using a high-speed stirrer, and the amount of the non-volatile content was adjusted to 50% by weight, thus preparing a resin varnish G which was a varnish of the resin composition.

The resin varnish G was applied to a PET film coated with a release agent using an applicator, and then the solvent in the resin composition was removed by drying so as to perform thermal curing, thus obtaining a film having a thickness of 100 μm. When the relative dielectric constant and the dielectric loss tangent were measured by a network analyzer (manufactured by Agilent Technologies, Inc.) resonant cavity perturbation method under the conditions of a measurement frequency of 10 GHz and a measurement temperature of 23° C., the relative dielectric constant was 2.85, and the relative dielectric loss tangent was 0.0187.

Production of Carrier Materials C and D

The obtained resin varnish G was applied to a PET film (polyethylene terephthalate, manufactured by Dupont Teijin Films, Purex film, thickness of 36 μm) using a die coater apparatus so that the dried resin layer had a thickness of 22.0 μm, and drying was performed for 5 minutes using a drying apparatus at 160° C., thus obtaining a resin sheet C with a PET film for a first resin layer (carrier material C).

In addition, the obtained resin varnish G was applied to a PET film (polyethylene terephthalate, manufactured by Dupont Teijin Films, Purex film, thickness of 36 μm) in a similar manner, and drying was performed for 5 minutes using a drying apparatus at 160° C. so that the dried resin layer had a thickness of 11.0 μm, thus obtaining a resin sheet D with a PET film for a second resin layer (carrier material N.

Production of Buildup Layer A

The obtained carrier material C and carrier material D were arranged on the two surfaces of a glass fiber base material (thickness of 15 μm, manufactured by Unitika Glass Fiber Co., Ltd., E glass woven fabric, E02Z 04 53SK, IPC standard 1015, coefficient of linear expansion: 5.5 ppm/° C.) so that each of the resin layers faced the glass fiber base material, and the glass fiber base material was impregnated with the resin composition by a vacuum laminator and a hot-air drying apparatus, thus obtaining a buildup layer A on which the PET film was laminated.

Specifically, each of the carrier material C and the carrier material D was superimposed on the two surfaces of the glass fiber base material so that the carrier materials were positioned in the center of the glass fiber base material in the width direction, and the carrier materials and the glass fiber base material were bonded using a laminating roll at 80° C. under the condition of reducing the pressure by $9.999\times10^4$ Pa (about 750 Torr) or more from the normal pressure.

Here, the resin layers of the carrier material C and the carrier material D were respectively bonded to the two surface sides of the glass fiber base material in the inner area of the glass fiber base material in the dimension of the width direction, and in the outer area of the glass fiber base material in the dimension of the width direction, the resin layers of the carrier material C and the carrier material D were bonded to each other.

Next, the buildup layer A was obtained by subjecting the bonded product to a heat treatment without applying pressure, by allowing the bonded product to pass through a horizontal transfer-type hot-air drying apparatus set to 120° C. for 2 minutes. At this time, the thickness of the first resin layer (C1) was 18 μm, the thickness of the glass fiber base material layer was 15 μm, and the thickness of the second resin layer (C2) was 7 μm. Therefore, the total thickness was 40 μm, and C2/C1 was 0.39. Note that the thickness of the resin layer was measured by cutting out the cross-section of the buildup layer A and observing the cross-section with an optical microscope.

Production of Circuit Board (1)

The PET film on the first resin layer side of the obtained buildup layer A was peeled off, and the first resin layer was superimposed on the front and rear of an inner layer circuit board with circuit patterns formed on both sides thereof (residual copper rate 70%, L/S=50/50 μm), using the obtained laminated plate (1) with a metal foil as the core substrate. Vacuum hot compression molding was performed thereon at a temperature of 150° C. and a pressure of 1 MPa for 120 seconds using a vacuum compression-type laminator. Then, thermal curing was performed with a hot-air drying apparatus at 220° C. for 60 minutes, and the PET film on the second resin layer side was peeled off. Next, a blind via hole (non-through hole) was formed by carbonic acid laser. Then, the inside of the via and the surface of the resin layer were immersed in a swelling solution of 60° C. (Swelling Dip Securiganth P, manufactured by Atotech Japan K.K.) for 5 minutes and further immersed in an aqueous potassium permanganate solution of 80° C. (Concentrate Compact CP, manufactured by Atotech Japan K.K.) for 10 minutes, and neutralization and a roughening treatment were performed.

Next, after undergoing degreasing, catalyst application, and activation processes, microcircuit processing of L/S=50 μm/50 μm was performed by forming an electroless copper plated film of about 0.5 μm, forming a plating resist, and forming pattern electroplating copper of 10 μm using the electroless copper plated film as a power feeding layer. Next, after performing an annealing treatment with a hot-air drying apparatus at 200° C. for 60 minutes, the power feeding layer was removed by flash etching.

The solder resist film (1) obtained in Example 1 was then superimposed, and vacuum hot compression molding was performed thereon at a temperature of 150° C. and a pressure of 1 MPa for 120 seconds using a vacuum compression-type laminator. Then, thermal curing was performed with a hot-air drying apparatus at 220° C. for 60 minutes, and the PET film was peeled off. Next, a blind via hole (non-through hole) was formed by carbonic acid laser so that a semiconductor element mounting pad or the like was exposed.

Finally, a circuit board (1) for a semiconductor package was obtained by forming, on a circuit layer exposed from the solder resist film (1), a plated layer consisting of an electroless nickel plated layer of 3 μm and an electroless gold plated layer of 0.1 μm that was formed on the electroless nickel plated layer, and cutting the obtained substrate into a size of 50 mm×50 mm.

A semiconductor element (TEG chip, size of 20 mm×20 mm, thickness of 725 μm) was mounted on the circuit board (1) for a semiconductor package by thermocompression bonding by a flip chip bonder. Next, a semiconductor package (1) was obtained by melting and bonding a solder bump in an IR reflow furnace, filling with a liquid encapsulation resin (CRP-X4800B, manufactured by Sumitomo Bakelite Co., Ltd.), and curing the liquid encapsulation resin. Note that the liquid encapsulation resin was cured under the conditions of a temperature of 150° C. and 120 minutes. As the solder bump of the semiconductor element, a solder bump having a composition of Sn/Ag/Cu formed by lead free solder was used.

The semiconductor package (1) was mounted on a circuit board for a semiconductor module by thermocompression bonding. Then, melting and bonding were performed in an IR reflow furnace using a solder ball. As the solder ball of the semiconductor package, a solder ball having a composition of Sn/Ag/Cu formed by lead free solder was used.

INDUSTRIAL APPLICABILITY

The resin composition for a solder resist, the solder resist film, and the circuit board according to the embodiments of the present invention have excellent low dielectric property and are useful in the field of resin-sealed electronic component devices. In particular, the resin composition for a solder resist, the solder resist film, and the circuit board according to the embodiments of the present invention are extremely useful in the field of electronic component devices for handling high-frequency signals (for example, a frequency band of 5 GHz to 90 GHz) used in next-generation communication system, millimeter wave radars, and the like.

DESCRIPTION OF REFERENCE SIGNS

10 Solder resist film
20 Circuit board
22 Core substrate
24 Conductor pattern
28 Opening portion
242 Line
244 Land
246 Plated film

The invention claimed is:

1. A resin composition for a solder resist comprising a thermosetting resin, an inorganic filler, and hollow resin particles, wherein the hollow resin particles comprise at least one selected from hollow resin particles (1) and hollow resin particles (2);

the hollow resin particles (1) comprise a shell including an aromatic polymer (P1) obtained by polymerizing a monomer composition containing an aromatic crosslinking monomer (a), an aromatic monofunctional monomer (b), and a (meth)acrylic acid ester-based monomer (c) represented by formula (1):

(1)

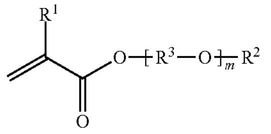

in which $R^1$ represents H or $CH_3$, $R^2$ represents H, an alkyl group or a phenyl group, $R^3$—O represents an oxyalkylene group having 2 to 18 carbon atoms, and m is an average addition molar number of the oxyalkylene group and represents an integer of 2 to 30;

the hollow resin particles (2) comprise a polymer (P) containing a structural unit (I) derived from a vinyl-based monomer and a structural unit (II) derived from a phosphoric acid ester-based monomer; and the hollow resin particles are contained in the resin composition for a solder resist in an amount of 1% by weight to 50% by weight with respect to the total solid content of the resin composition for a solder resist.

2. A solder resist film formed from the resin composition for a solder resist according to claim 1.

3. A circuit board comprising a substrate and a conductive circuit formed on the substrate, wherein the solder resist film according to claim 2 is formed on an outermost layer of the substrate.

* * * * *